US008214789B2

(12) United States Patent
Boose

(10) Patent No.: US 8,214,789 B2
(45) Date of Patent: Jul. 3, 2012

(54) METHOD AND SYSTEM FOR KEYBOARD MANAGING AND NAVIGATING AMONG DRAWING OBJECTS

(75) Inventor: John H. Boose, Bellevue, WA (US)

(73) Assignee: The Boeing Company, Chicago, IL (US)

(*) Notice: Subject to any disclaimer, the term of this patent is extended or adjusted under 35 U.S.C. 154(b) by 748 days.

(21) Appl. No.: 11/538,028

(22) Filed: Oct. 2, 2006

(65) Prior Publication Data
US 2008/0082948 A1  Apr. 3, 2008

(51) Int. Cl.
*G06F 15/04* (2006.01)
*G06F 17/50* (2006.01)
(52) U.S. Cl. ......... 716/139; 716/102; 707/824; 345/619
(58) Field of Classification Search .............. 716/8–11, 716/102, 139; 703/1; 345/418, 619; 382/181, 382/276; 715/700
See application file for complete search history.

(56) References Cited

U.S. PATENT DOCUMENTS

| | | | |
|---|---|---|---|
| 5,008,847 A | 4/1991 | Lapeyre | |
| 6,516,456 B1* | 2/2003 | Garnett et al. ........... | 716/8 |
| 6,606,731 B1 | 8/2003 | Baum et al. | |
| 6,738,957 B2* | 5/2004 | Gont et al. ............... | 716/11 |
| 6,766,331 B2 | 7/2004 | Shema et al. | |
| 2002/0191848 A1 | 12/2002 | Boose et al. | |
| 2003/0025734 A1* | 2/2003 | Boose et al. ............. | 345/765 |
| 2003/0061600 A1* | 3/2003 | Bates et al. .............. | 717/133 |
| 2003/0195640 A1* | 10/2003 | Krocker et al. .......... | 700/26 |
| 2004/0263480 A1* | 12/2004 | Pagan ...................... | 345/172 |
| 2005/0114096 A1 | 5/2005 | Baum et al. | |
| 2005/0160377 A1* | 7/2005 | Sciammarella et al. ... | 715/838 |
| 2005/0212823 A1* | 9/2005 | Uthe et al. ................ | 345/660 |
| 2006/0274060 A1* | 12/2006 | Ni et al. ................... | 345/419 |

OTHER PUBLICATIONS ("Visualizing Large Graphs with Compound-Fisheye Views and Treemaps", by James Abello, Stephen G. Kobourov, and Roman Yusufov, @ Springer-Verlag Berlin Heidelberg—2004.*
EP extended search for application 07019320.6 dated Feb. 18, 2011.

* cited by examiner

*Primary Examiner* — Paul Dinh
*Assistant Examiner* — Nha Nguyen
(74) *Attorney, Agent, or Firm* — Yee & Associates, P.C.

(57) ABSTRACT

A system and method for navigating drawings on a computing system is provided. The method includes loading drawings and associated object data. The drawings and the associated object data are arranged into at least two types of navigation networks, each type of navigation network having a plurality of parameters to interact with the drawings. Keys in a keyboard are mapped based on the plurality of parameters of the at least two types of navigation networks. A navigation network for the drawings is selected from the at least two types of navigation networks and the drawings are displayed. The drawings are manipulated using the mapped keys based on the selected navigation network, wherein the at least two types of networks include at least two of a row and column network, a flow chart network, a wiring diagram network, and a component location drawing navigation network.

15 Claims, 34 Drawing Sheets

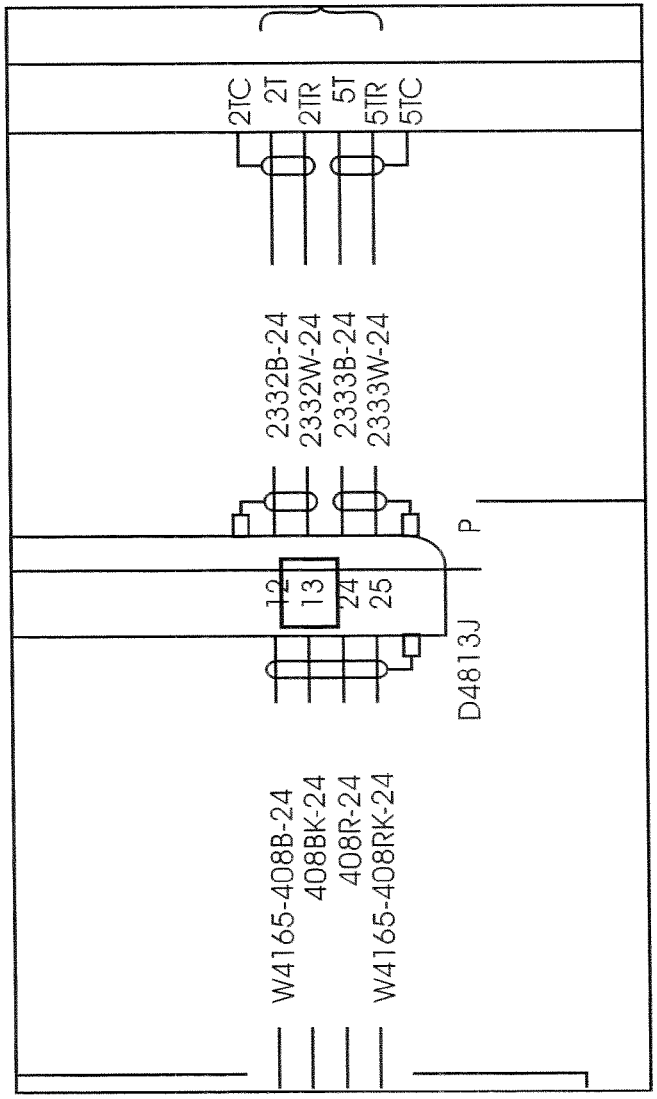

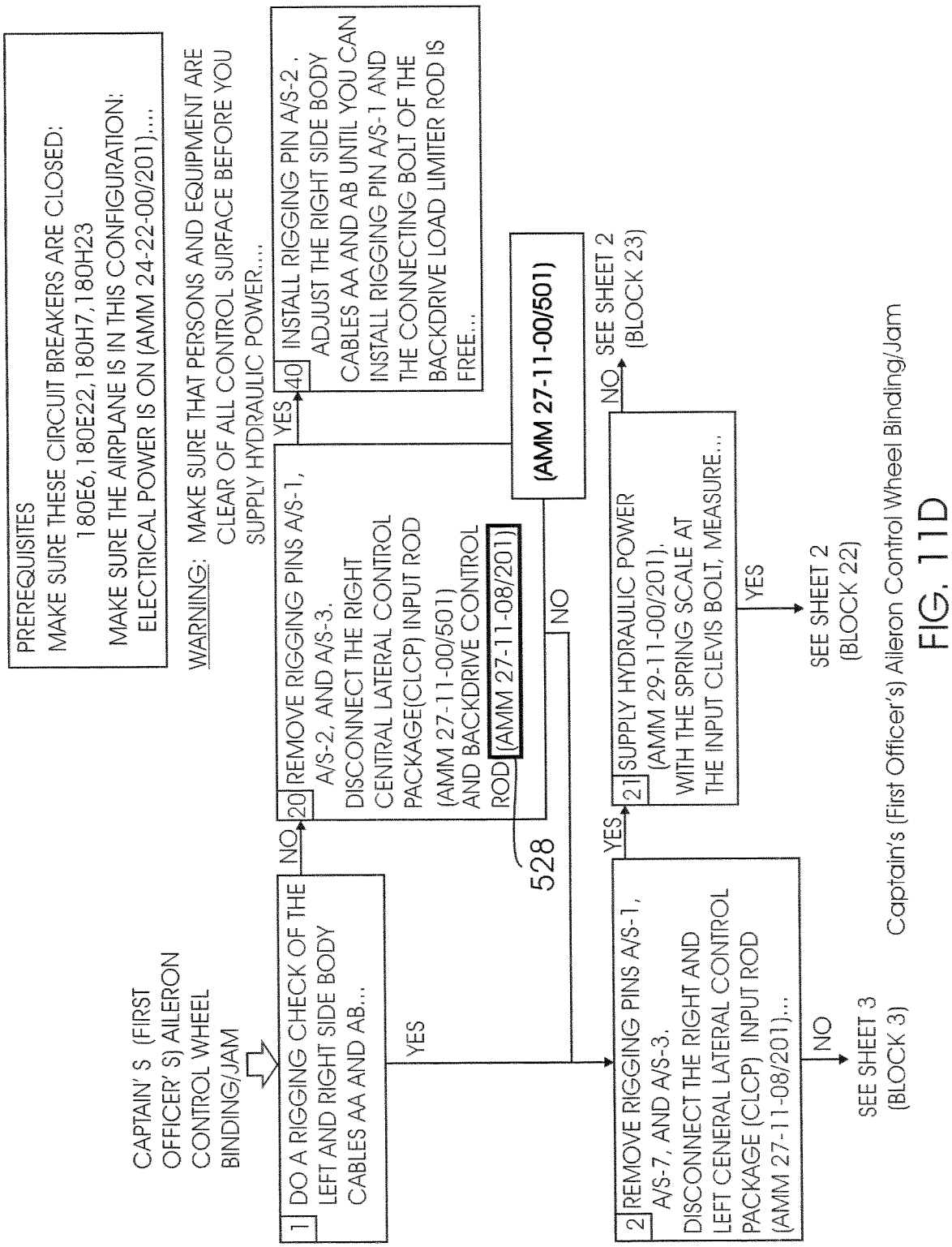
FIG. 11D  Captain's (First Officer's) Aileron Control Wheel Binding/Jam

| COMPONENT | FIG-102 SHT | QTY | ACCESS/AREA | AMM REFERENCE |
|---|---|---|---|---|
| HEATER - CAPT FOOT - LEFT, H519 | ☐ | 1 | FLT COMPT | |
| HEATER - CAPT FOOT - RIGHT, H520 | ☐ | 1 | FLT COMPT | |
| HEATER - CAPT SHOULDER, H523 | ☐ | 1 | FLT COMPT | |
| HEATER - CREW REST AREA, H513 | ☐ | 1 | AREA ABOVE CEILING, RIGHT | |
| HEATER - DOOR AREA 1 - R, B7091 | ☐ | 1 | FIRST PASS. CABIN DOOR, RIGHT | |
| HEATER - DOOR AREA 1 - L, B7092 | ☐ | 1 | FIRST PASS. CABIN DOOR, LEFT | |
| HEATER - DOOR AREA 2 - R, B7093 | ☐ | 1 | SECOND PASS. CABIN DOOR, RIGHT | |
| HEATER - DOOR AREA 2 - L, B7094 | ☐ | 1 | SECOND PASS. CABIN DOOR, LEFT | |
| HEATER - DOOR AREA 3 - R, B7095 | ☐ | 1 | THIRD PASS. CABIN DOOR, RIGHT | |
| HEATER - DOOR AREA 3 - L, B7096 | ☐ | 1 | THIRD PASS. CABIN DOOR, LEFT | |
| HEATER - DOOR AREA 4 - R, B7097 | ☐ | 1 | FOURTH PASS. CABIN DOOR, RIGHT | |
| HEATER - DOOR AREA 4 - L, B7098 | ☐ | 1 | FOURTH PASS. CABIN DOOR, LEFT | |
| HEATER - DOOR AREA 5 - R, B8470 /2\ | ☐ | 1 | FIFTH PASS. CABIN DOOR, RIGHT | |
| HEATER - DOOR AREA 5 - L, B8471 /2\ | ☐ | 1 | FIFTH PASS. CABIN DOOR, LEFT | |
| HEATER - FLT DK CREW REST, H534 | ☐ | 1 | FLT DK CREW REST SIDEWALL | |
| HEATER - FWD CARGO - R, H526 | ☐ | 1 | FWD CARGO COMPT, FWD HALF, RIGHT | |
| HEATER - FWD CARGO - L, H525 | ☐ | 1 | FWD CARGO COMPT, FWD HALF, LEFT | |
| HEATER - F/O AUXILIARY SHOULDER, H524 | ☐ | 1 | FLT COMPT | |
| HEATER - F/O FOOT - L, H521 | ☐ | 1 | FLT COMPT | |
| HEATER - F/O FOOT - R, H522 | ☐ | 1 | FLT COMPT | |
| HEATER - UPR DK DOOR AREA - L, B1628 /5\ | ☐ | 1 | UPR DECK DOOR, LEFT | |
| HEATER - UPR DK DOOR AREA - R, B1629 /5\ | ☐ | 1 | UPR DECK DOOR, RIGHT | |
| HEATER - ZONE B CRA, H546 /4\ | ☐ | 1 | AREA ABOVE CEILING RIGHT | |

FIG. 12A

HEATER - ZONE F CRA, H533
HEATER BLANKET - SIDE CARGO DOOR [1>

DOOR - AFT, X195
DOOR - MID, X196
DOOR - FWD, X197
FWD, X198

INDICATOR - DOOR 5 OVHD CRA TEMPERATURE, M309
INDICATOR - ZONE F TEMP, M315

CABIN TEMP, n7329
COMBI ZONE SELECT, M6847 [1>

ENG/APU/CARGO FIRE CONTROL, M7326
MODULE - CAPT HEATER CONTROL, M7375
MODULE - F/O HEATER CONTROL, M7376

* SEE THE WDM EQUIPMENT LIST

[4> DLH 001-099
[5> AFA 241-280

| | | | | F | G | | H |
|---|---|---|---|---|---|---|---|
| | | | | AREA ABOVE CEILING LEFT | | | |
| | □ | | 1 | MAIN DECK, AFT OF THE SIDE CARGO DOOR | | * | |
| | | | | | | | |
| | □ | | 1 | MAIN DECK, SIDE CARGO DOOR AREA | | * | |
| | | | 1 | MAIN DECK, SIDE CARGO DOOR AREA | | * | |
| | | | 1 | MAIN DECK, SIDE CARGO DOOR AREA | | * | |
| | | | 1 | MAIN DECK, FWD OF THE SIDE CARGO DOOR | | * | |
| | □ | | 1 | DOOR 5 OVHD CRA | | * | |
| | | | 1 | ZONE F CRA | | * | |
| | | | | | | | |
| | □ | | 1 | FLT COMPT, P44 | | | |
| | □ | | 1 | FLT COMPT, P45 | | * | |

METHOD AND SYSTEM FOR KEYBOARD MANAGING AND NAVIGATING AMONG DRAWING OBJECTS

BACKGROUND

1. Field of Invention

This invention relates generally to computing systems, and in particular, to a method and system for managing and navigating among drawing objects.

2. Background of the Invention

Electronic schematic diagrams are used to illustrate complex and non-complex assemblies/systems (used interchangeably throughout this specification). These assemblies often have more than one component or drawing object. Drawing objects, as used in this application, refer to any type of element that is part of a system/assembly. Often the drawing objects are interconnected either individually or as a part of sub-assemblies. For example, in electrical wiring diagrams, drawing objects include modules, plugs, switches, buses, power sources, grounds, wires, connectors, etc.

Laptops today are commonly used for mobile computing. One may want to view complex drawings on a "hardened" field laptop display screen. This may be difficult because a field laptop may be covered with a rubbery substance to prevent damage and field laptop pointing devices (i.e. joy sticks, tilt pads, touch pads and others) may wear out due to usage in the field.

This makes it difficult to manipulate complex technical drawings, such as performing pan and zoom operations on individual drawings and sets of drawings, follow circuit logic, navigate through diagnostic decision trees, and examine lengthy bills of materials. Furthermore, selecting/manipulating small objects using hardened joysticks, tilt-pads, and other devices can be very challenging.

Users of technical drawings on every day laptops and workstations have similar problems. Users move their hands back and forth between keys and cursor pointer devices to select and manipulate drawing objects.

Therefore, what is needed an efficient system and method for users to examine and manipulate complex technical drawings.

SUMMARY OF THE INVENTION

In one aspect of the present invention, a method for navigating drawings on a computing system is disclosed. The method comprising: loading drawings and associated object data; arranging the drawings and the associated object data into at least two types of navigation networks, each type of navigation network having a plurality of parameters to interact with the drawings; mapping keys in a keyboard based on the plurality of parameters of the at least two types of navigation networks; selecting a navigation network for the drawings from the at least two types of navigation networks and displaying the drawings; and manipulating the drawings using the mapped keys based on the selected navigation network, wherein the at least two types of networks include at least two of a row and column network, a flow chart network, a wiring diagram network, and a component location drawing navigation network.

In another aspect of the present invention, a system for navigating drawings on a computing system is disclosed. The system comprising: a drawing object module for collecting the drawing objects and storing the drawing objects in a database; an object linkage module for receiving the drawing objects from the database and linking the drawing objects together into drawings with at least two types of navigation networks, each type of navigation network having a plurality of parameters to interact with the drawings; and a user interface, having a keyboard, to select a type of navigation network for the drawings from the at least two types of navigation networks, wherein keys on the keyboard are mapped to specific commands based on the plurality of parameters to interact with the drawings for the type of navigation network, wherein the at least two types of networks include at least two of a row and column network, a flow chart network, a wiring diagram network, and a component location drawing navigation network and wherein a user selects a navigation network for the drawings from the at least two types of navigation networks and navigates the drawing objects of the drawings using the mapped keys for the selected type of navigation network.

In yet another embodiment, a method for navigating drawings on a computing system is disclosed. The method comprising: (a) loading drawings and associated object data; (b) arranging the drawings and the associated object data into at least a component location drawing navigation network and a second type of navigation network selected from among a row and column network, a flow chart network and a wiring diagram network; wherein each type of navigation network having a plurality of parameters to interact with the drawings; (c) mapping keys in a keyboard based on the plurality of parameters of the component location drawing navigation network and the second type of navigation network; (d) displaying the drawings based on a selected a navigation network from among the component location drawing navigation network, the row and column network, the flow chart network and the wiring diagram network and; and (e) manipulating the drawings using the mapped keys based on the selected navigation network in step (d).

This brief summary has been provided so that the nature of the invention may be understood quickly. A more complete understanding of the invention can be obtained by reference to the following detailed description of the preferred embodiments thereof in connection with the attached drawings.

BRIEF DESCRIPTION OF THE DRAWINGS

The foregoing features and other features of the present invention will now be described with reference to the drawings of a preferred embodiment. The illustrated embodiment is intended to illustrate, but not to limit the invention. The drawings include the following:

FIGS. 7A-7B show an example of navigation and object selection results on a wiring diagram using a simple row and column network;

FIGS. 11A-11D show an example of navigating objects in a diagnostic flow chart, according to one aspect of the present invention;

FIG. 12 (FIGS. 12A-12B) is an example of navigating among objects in a table, according to one aspect of the present invention;

DETAILED DESCRIPTION OF THE PREFERRED EMBODIMENTS

In one aspect of the present invention, a system and method are provided for navigating drawing objects in drawings (or diagrams) using mapped keys on a keyboard. This improves navigation on laptops, workstations, and devices with small form factors such as cell phones and PDA's.

To facilitate an understanding of the preferred embodiment, the general architecture and operation of a computing system will be described first. The specific process under the preferred embodiment will then be described with reference to the general architecture.

Computing System

Figure 1A:
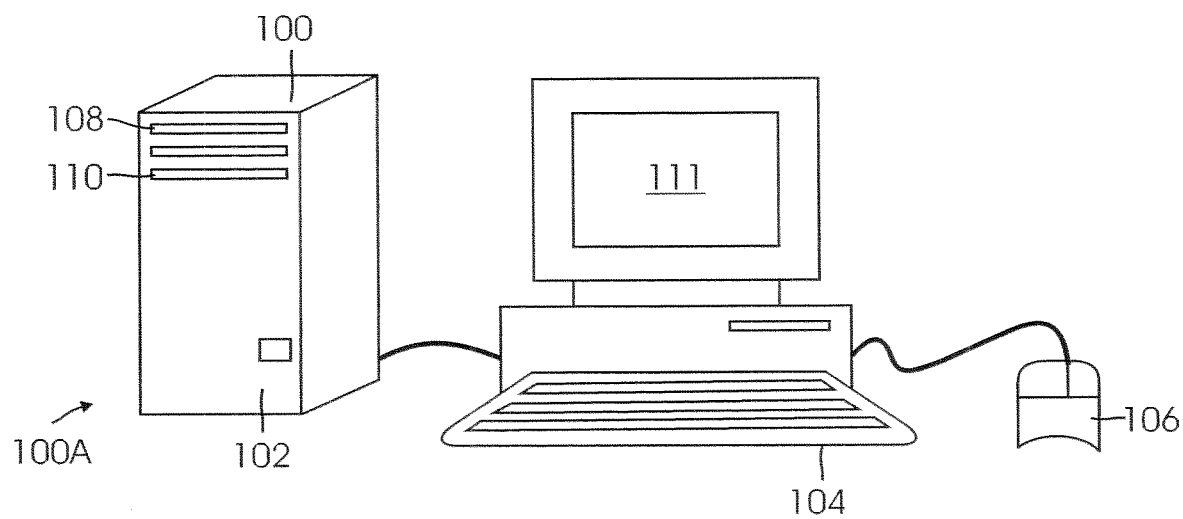
FIG. 1A shows a block diagram of a computing system for executing process steps, according to one aspect of the present invention.

FIG. 1A is a block diagram of a computing system 100A for executing computer executable process steps according to one aspect of the present invention. FIG. 1 includes a host computer 100 and a monitor 111. Monitor 111 may be a CRT type, a LCD type, or any other type of color or monochrome display.

Also provided with computer 100 are a keyboard 104 for entering data and user commands, and a pointing device (for example, a mouse) 106 for processing objects displayed on monitor 111.

Computer 100 includes a computer-readable memory storage device 108 for storing readable data. Besides other programs, storage device 108 can store application programs including web browsers and computer executable code, according to the present invention.

According to one aspect of the present invention, computer 100 can also use removable storage device 110 (for example: floppy disk drive, memory stick, CD-ROM, or CD R/W (read/write) or other device) for storing data files, application program files, and computer executable process steps embodying the present invention.

A modem, an integrated services digital network (ISDN) connection, or the like also provide computer 100 with a Network connection 102—to a network (e.g. the Internet), of computers within a company or entity in the company (for example: an Intranet). The network connection 102 allows computer 100 to download data files, application program files and computer-executable process steps embodying the present invention from the Internet.

Figure 1B:
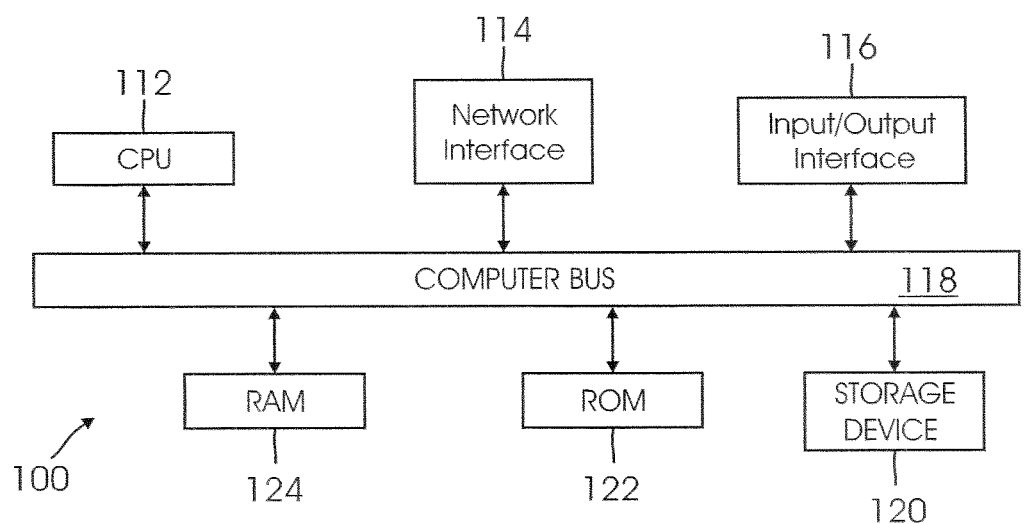
FIG. 1B shows the internal architecture of the computing system of FIG. 1.

FIG. 1B shows a top-level block diagram showing the internal functional architecture of a computing system 100 (host computer 100 or computer 100) that may be used to execute the computer-executable process steps, according to one aspect of the present invention. As detailed in FIG. 1B, computing system 100 includes a central processing unit (CPU) 112 for executing computer-executable process steps and interfaces with a computer bus 118.

Computing system 100 includes an input/output interface 116 that operatively connects output display device such as monitors (111), input devices such as keyboards (104) and pointing device such as a mouse (106) to computing system 100.

A storage device 120 (similar to storage device 108) also interfaces to computing system 100 through computer bus 118. Storage device 120 may be disks, tapes, drums, integrated circuits, or the like, operative to hold data by any means, including magnetically, electrically, optically, and the like. Storage device 120 stores operating system program files, application program files, computer-executable process steps, web-browsers and other files. Some of these files are stored on storage device 120 using an installation program. For example, CPU 112 executes computer-executable process steps of an installation program so that CPU 112 can properly execute the application program.

Random access memory ("RAM") 124 also interfaces to computer bus 118 to provide CPU 112 with access to memory storage. When executing stored computer-executable process steps from storage device 120, CPU 112 stores and executes the process steps out of RAM 124.

Read only memory ("ROM") 122 is provided to store invariant instruction sequences such as start-up instruction sequences or basic input/output operating system (BIOS) sequences.

Computing system 100 can be connected to other computing systems through the network interface 114 using computer bus 118. Network interface 114 may be adapted to one or more of a wide variety of networks, including local area networks, storage area networks, wide area networks, the Internet, and the like.

It is noteworthy that the present invention is not limited to the layout shown in FIGS. 1A and 1B. For example, hand-held computers, notebook or laptop computers, set-top boxes or any other computing system (wired or wireless) capable of running computer-executable process steps, as described below, may be used to implement the various aspects of the present invention.

Figure 2:
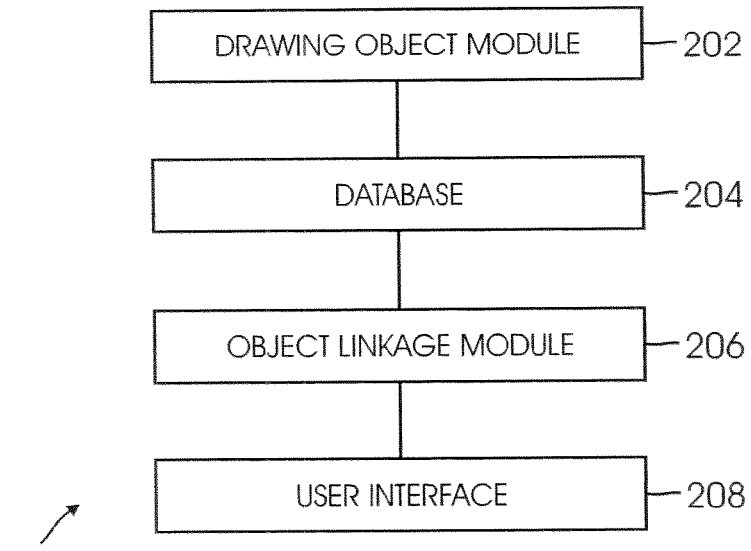
FIG. 2 shows a system for navigating drawing objects in a drawing, according to one aspect of the present invention.

Turning to FIG. 2, a system 200 for navigating drawing objects in a drawing, according to one aspect of the present invention, is shown. In system 200, a drawing object module 202 collects the drawing objects and stores them in a database 204. Drawing objects include, but are not limited to, wires, text references, off-sheet references, and selectable components, such as switches, pins, fuses, and others.

An object linkage module 206 receives the objects from database 204 and links the objects together building various types of navigation networks (or "networks"), such as a row/column network and wiring diagram network. Automatically understanding the content and recognizing the objects in these drawings is the subject of U.S. Pat. No. 6,606,731 entitled "Intelligent wiring diagram system", issued on Aug. 13, 2003; U.S. Pat. No. 6,766,331 entitled "Method, computer program product, and system for creating and viewing an intelligent graphics file including parts information", issued on Jul. 20, 2004; US Patent application 20030025734 entitled, "Method, computer program product, and system for performing automated linking between sheets of a drawing set", Ser. No. 09/971,283, filed on Oct. 4, 200; and U.S. patent application entitled "Method and system for analyzing image differences", Ser. No. 11/339,599, filed on Jan. 25, 2006; all of which are assigned to the assignee of the present application, and the disclosures of which are incorporated herein by reference in their entireties.

Object linkage module 206 is connected to a user interface 208, such as computing system 100A in FIG. 1. User interface 208 displays the network containing drawing objects. Keys on keyboard 104 of user interface 208 are mapped to specific commands, such as up, down, left, right and the user navigates the drawing objects using the mapped keys.

Keyboard 104 is mapped based on the type of network being viewed and can continually be re-mapped based on the needs of the user. For example, if the user was viewing a row/column network, the user might want to use the letters 'R' and 'C' which will help remind the user to use the key 'R' to move by row and the key 'C' to move by column.

Figure 3:
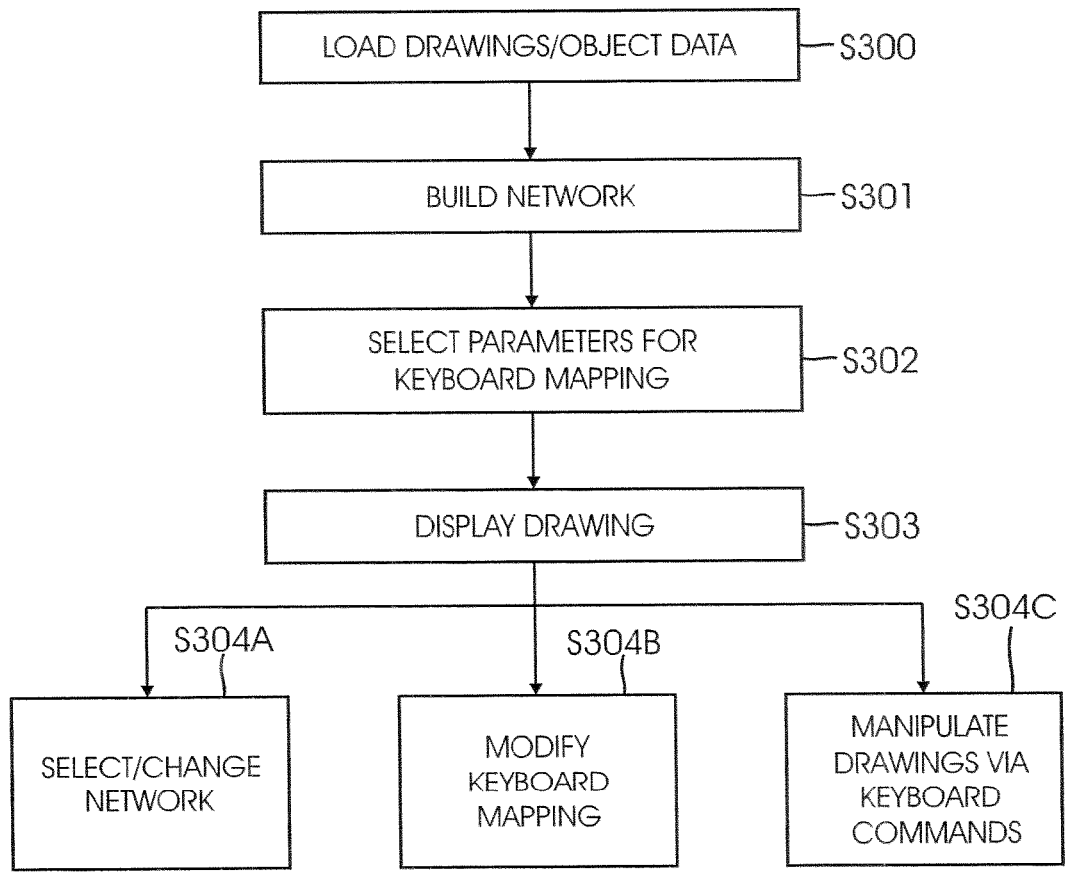
FIG. 3 shows a process flow diagram for navigating complex drawings, according to one aspect of the present invention.

Process Flow:

FIG. 3 shows a process flow diagram for navigating complex drawings, according to one aspect of the present invention. Schematic diagrams (or drawings) are automatically generated. Automatically generating drawings is the subject matter of U.S. patent application entitled "Method and system for automatically generating schematics", Ser. No. 11/346,103, filed on Oct. 2, 2006 and assigned to the assignee of the present application, and the disclosure of which is incorporated herein by reference in its entirety.

In step S300, the drawings and associated object data are loaded. In step S301, networks are built from the drawings and object data. A network can be a loose arrangement of objects in rows or columns, or a more sophisticated task-based arrangement of objects. (The networks can be pre-computed, computed when they are loaded into a viewer or computed on the fly.) In step S302, parameters are selected for keyboard mapping. Using keys allows the user to navigate through the objects in the drawings in a task based way. The different objects can be displayed based on the selected parameters. These parameters included, but are not limited to, keyboard command mapping (i.e. mapping specific command to specific keys on keyboard 104), navigation method (i.e., simple row and column navigation or task-based navigation based on the type of drawing and its contents), and object filtering (i.e., for a wiring diagram, "All object;" "Off-sheet references only;" "Wires only;" "Components only;" "Text references only;"). The user can then interact with the drawing objects based on these parameters.

In step S303, the drawings are displayed on user interface 208. Once the drawings have been displayed, the user can manipulate the drawings by selecting or changing the type of network (for example, from a row/column network to a flow chart network) in step S304A; changing the mapping for the keyboard commands in step S304B; or manipulating the drawings through the keyboard commands in step S304C. Steps S304A-S304C may occur in any order or simultaneously. Furthermore, the user can change the network at run time; can change the key board mapping at run time or re-compute the network and key mapping.

Different types of networks include a row/column network and a network that follows the wiring continuity. The user can select either of these networks to manipulate the drawings depending on the task or what is most convenient. For example, if the user is reviewing all the connector labels on a drawing, the row/column network would be the most appropriate network or the user can select a wiring diagram network if following the wire continuity is more preferable.

Figure 4:
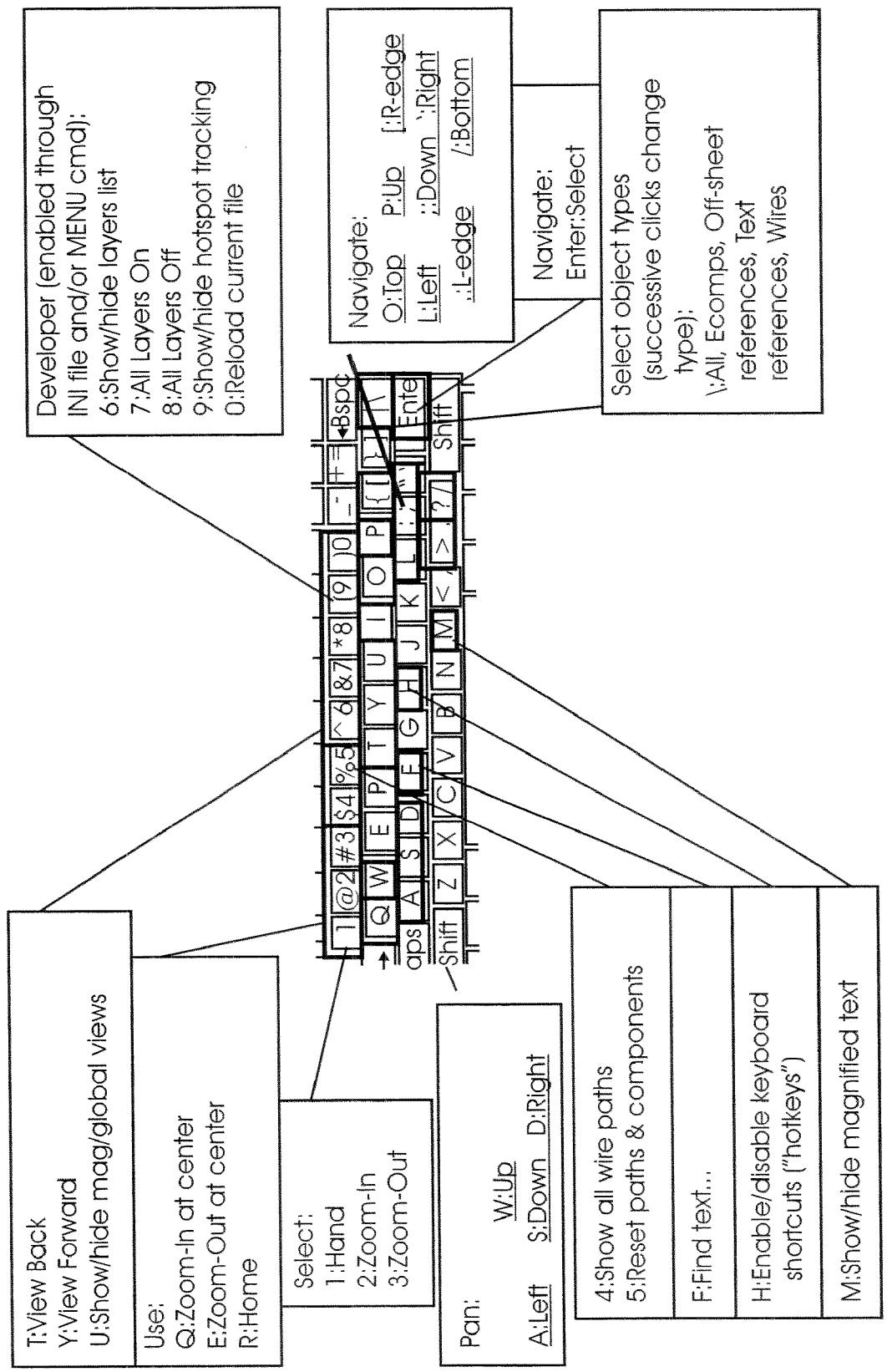
FIG. 4 shows an example of keyboard mapping, according to one aspect of the present invention.
Figure 5A:
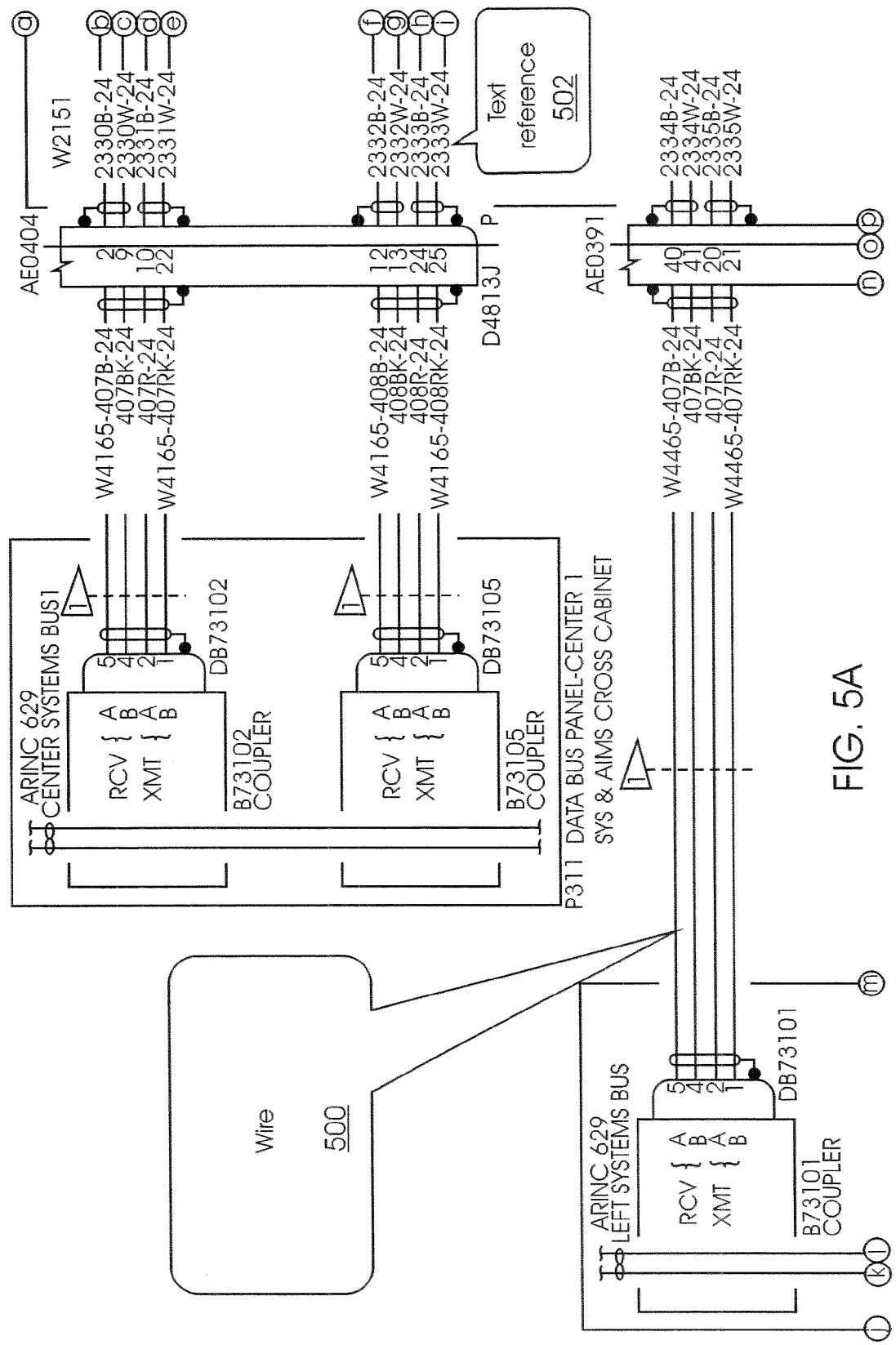
FIG. 5 (FIGS. 5A-5D) shows an example of a schematic diagram for use in navigating objects, according to one aspect of the present invention.
Figure 5B:
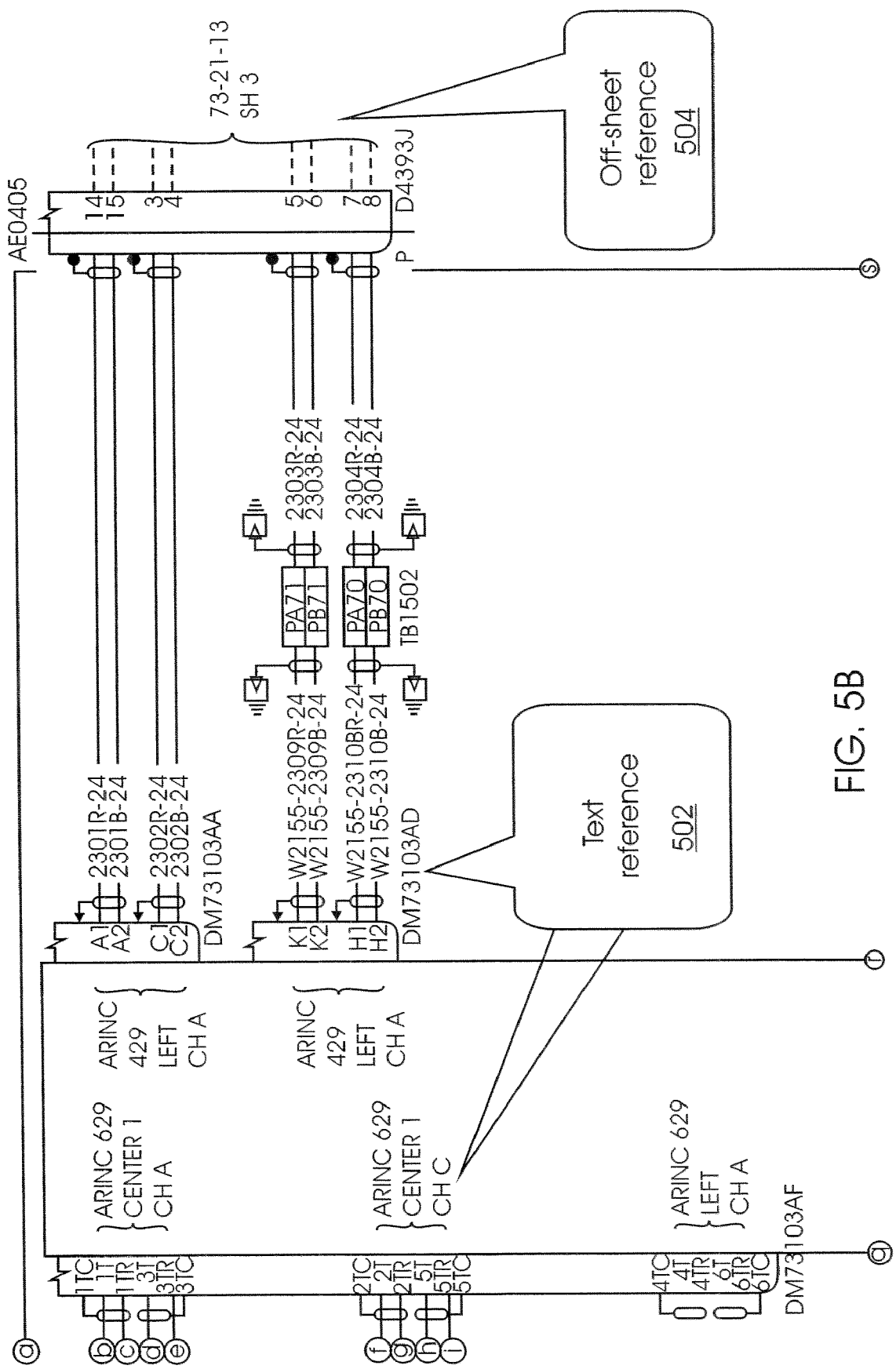
Figure 5C:
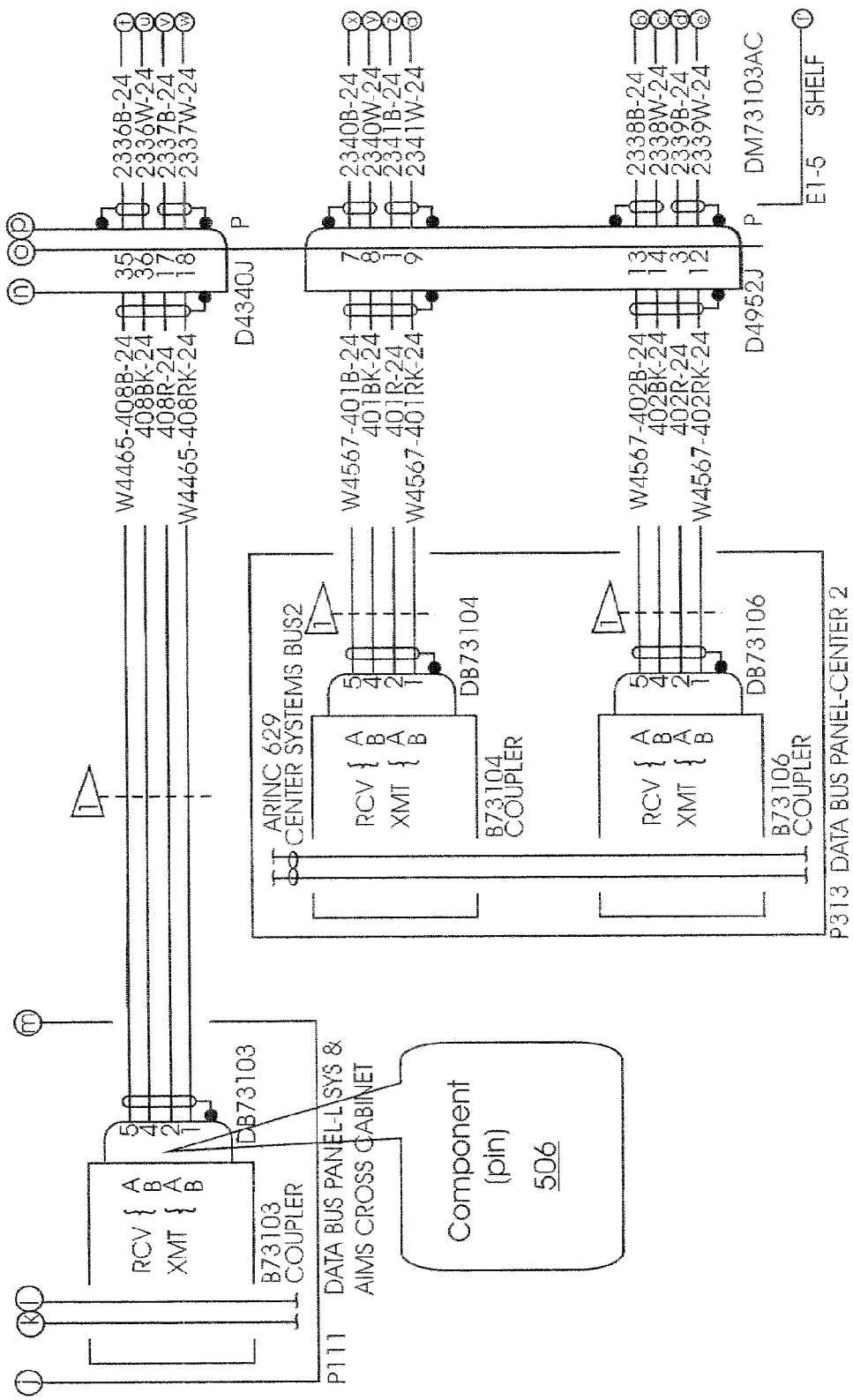
Figure 5D:
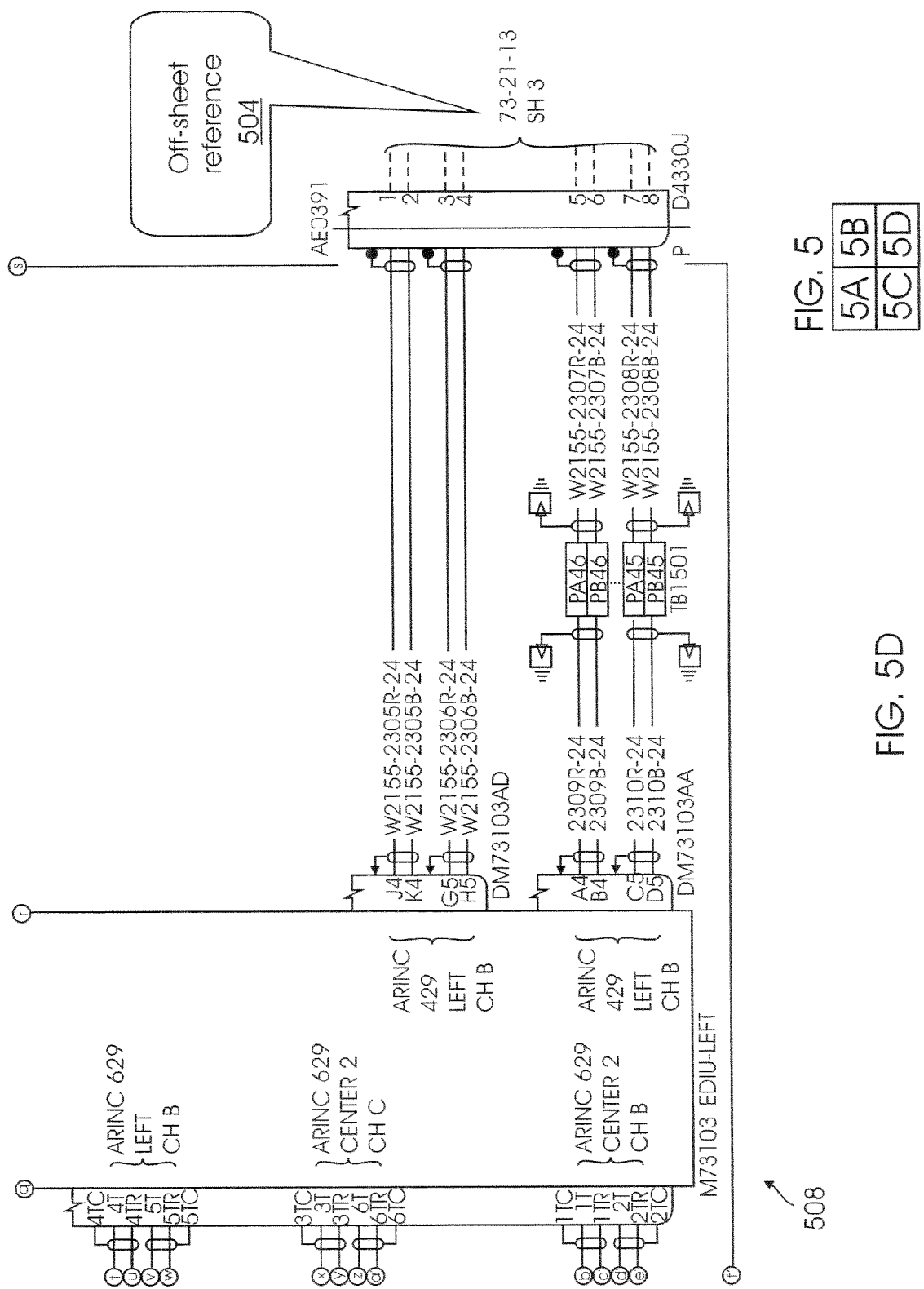

FIG. 4 shows an example of keys on a keyboard that have been mapped to specific commands, according to one aspect of the present invention. For example, as can be seen in FIG. 4, selecting key '4' causes the diagram to show all the wires and selecting key '5' resets paths and components. This is by way of example only, and each user can determine what key is mapped with what command.

FIGS. 5-14 show examples of using the system and method of the present invention with different types of networks.

FIG. 5 (FIGS. 5A-5D) shows an example of an electronic schematic diagram 508 for use in the present invention. Electronic schematic diagram 508 is a wiring diagram having navigable objects. Navigable objects include wires 500, text references 502, off-sheet references 504, and selectable components 506 such as switches, pins, fuses, and others. The system and method of the present invention allows a user to map keys on a keyboard with specific commands for navigating the drawing objects. For example, five commands could be used to navigate through the network. These commands include (1) Left; (2) Right; (3) Up; (4) Down; and (5) Select. These commands can be mapped to any key on the keyboard. In one aspect, the four cursor keys are mapped to the Left, Right, Up, and Down commands; and Enter is mapped to the Select command. Alternative keyboard mapping commands may include North, East, South, West, as well as diagonal navigation with NW, NE, SE, and SW. This increases the complexity of the navigation while yielding more precision and requiring fewer keystrokes to move to a desired object.

The simplest type of network connects objects in loose rows and columns where Left and Right commands move among objects in rows; and Up and Down commands move among objects in columns. The select command performs an object-specific action. For example, selecting an off-sheet reference causes the system to navigate to the reference; selecting a wire highlights its circuit network, and selecting a Reference Designator causes the system to show tabular data associated with the component.

More sophisticated networks link objects in task-related ways. For example, a wiring diagram network might link electrical components with regard to circuit continuity, while a logic diagram might link components with regard to the flow of diagnostic logic.

Figure 6A:
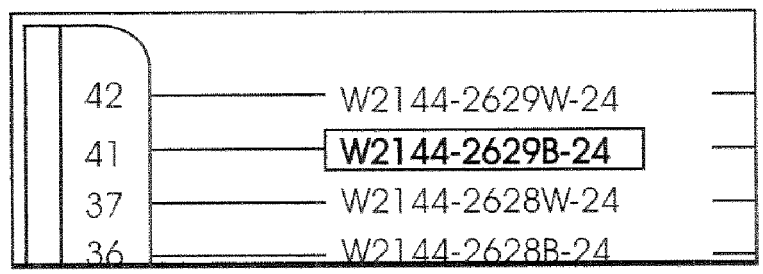
FIGS. 6A-6D show different methods for highlighting objects while navigating through a network.
Figure 6B:
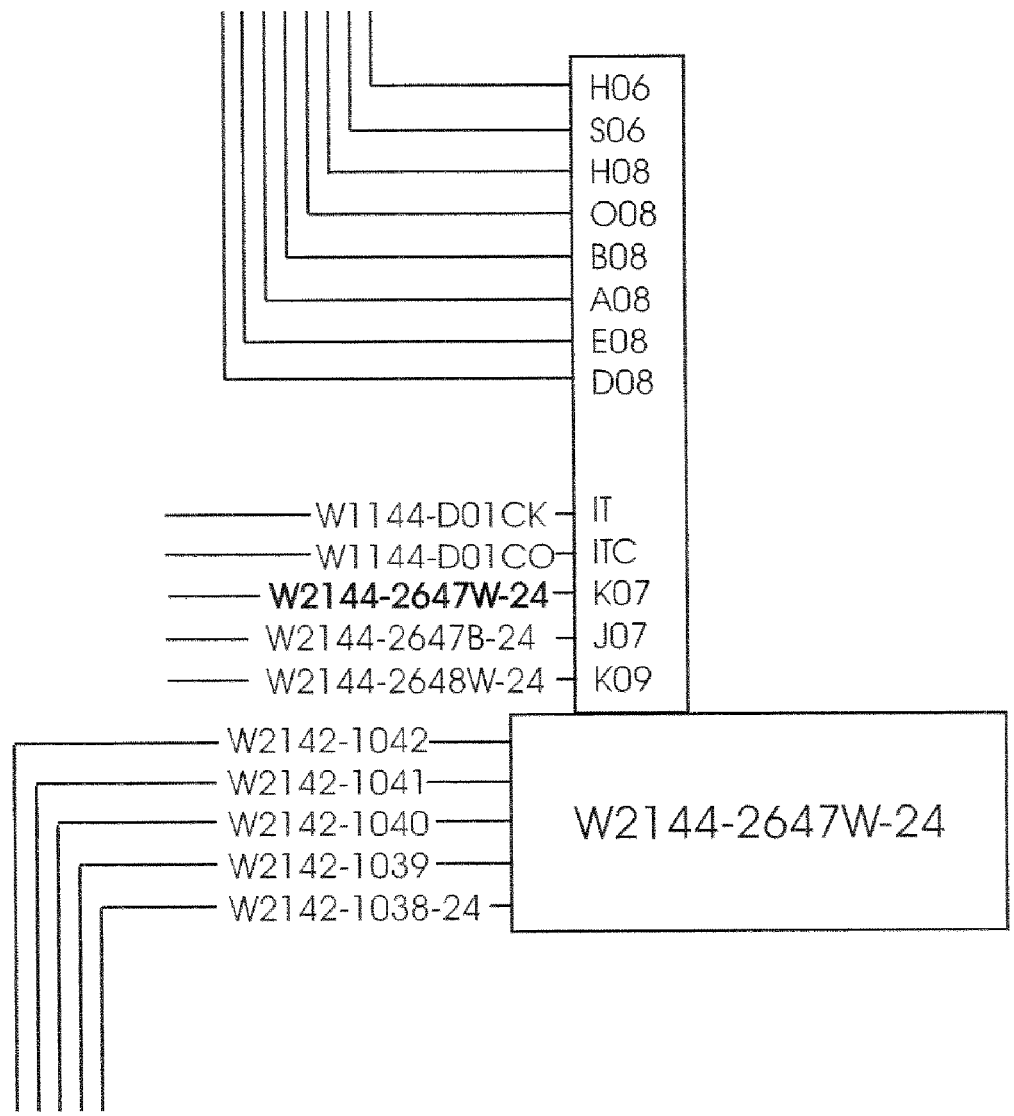
Figure 6C:
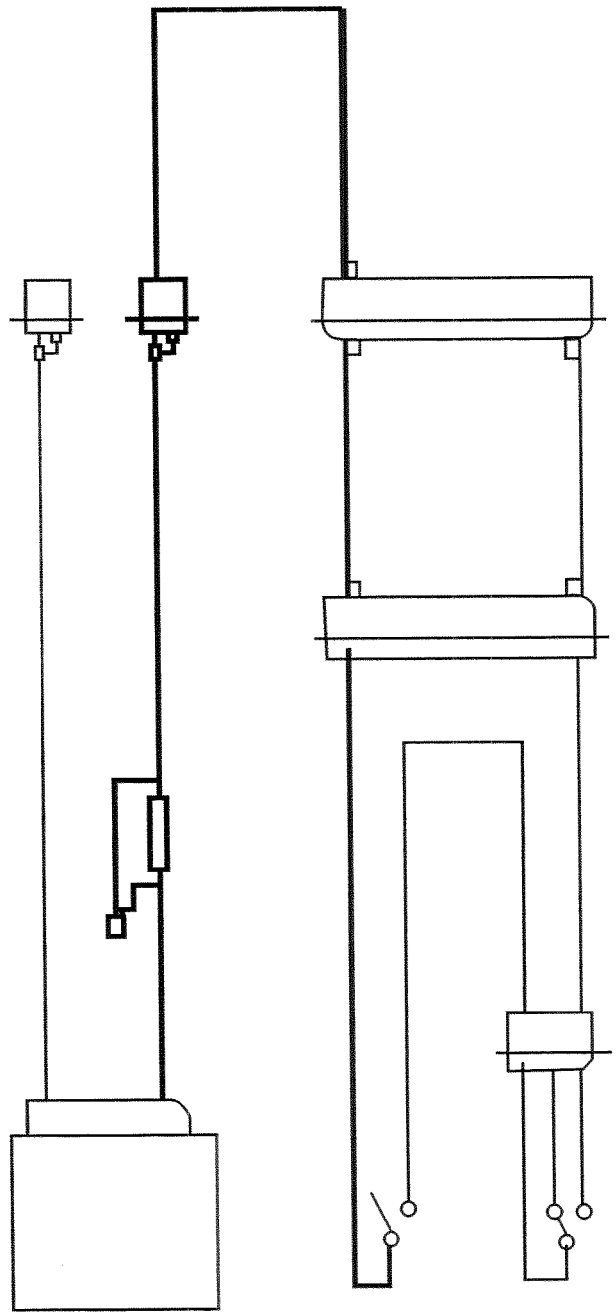
Figure 6D:
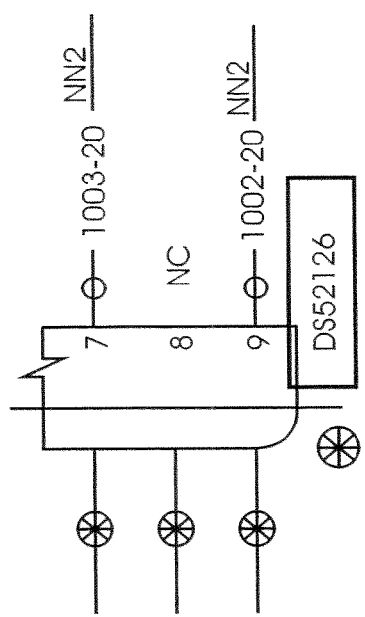

Several methods may be used to identify an object on the drawing selected by the user. FIGS. 6A-6D show different methods of identifying objects while navigating through a drawing. In FIG. 6A, objects are identified by highlighting text. In FIG. 6B, objects are identified by magnifying text. In FIG. 6C, the objects are identified by highlighting the objects. In FIG. 6D, the objects are identified by placing a box around the objects.

FIGS. 7A-7B show an example of navigation on a wiring diagram using a row and column network. FIG. 7A shows an enlarged view of the wiring diagram in FIG. 5, where the user has navigated to '13' which is a text reference associated with a pin in a connector. Once the object has been highlighted, in this case pin 13, the user can select the highlighted object to view the object in greater detail, as shown in FIG. 7B. Selecting pin 13 causes a table to be displayed showing data related to pin 13, such as the reference description.

Figure 8A:
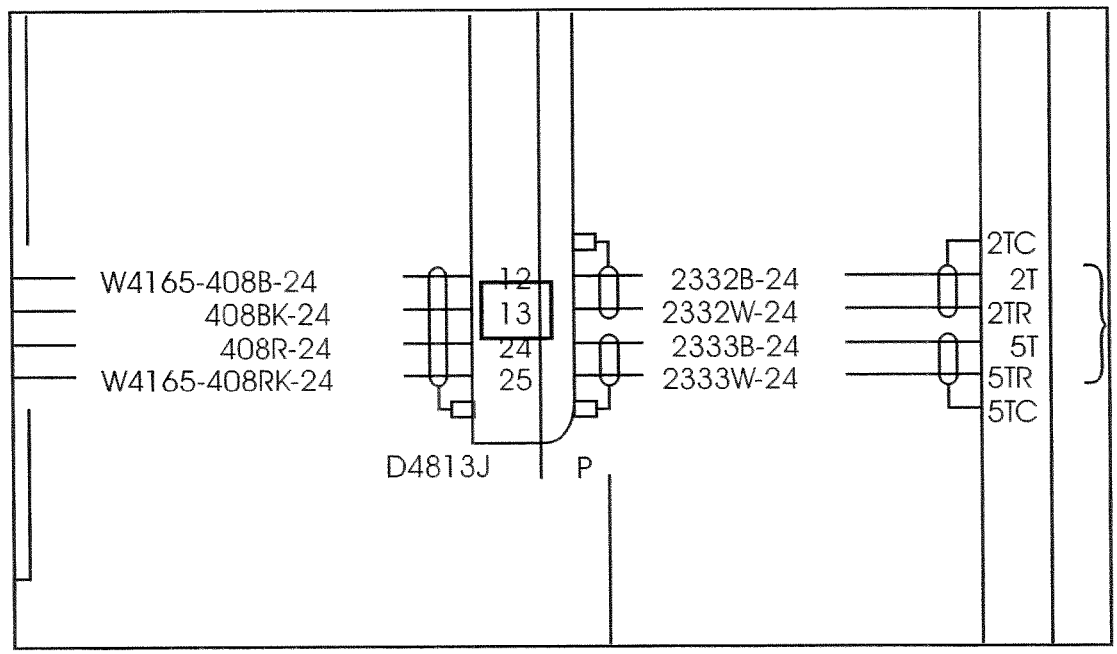
FIGS. 8A-8G show an example of navigating on a schematic and highlighting different objects, according to one aspect of the present invention.
Figure 8B:
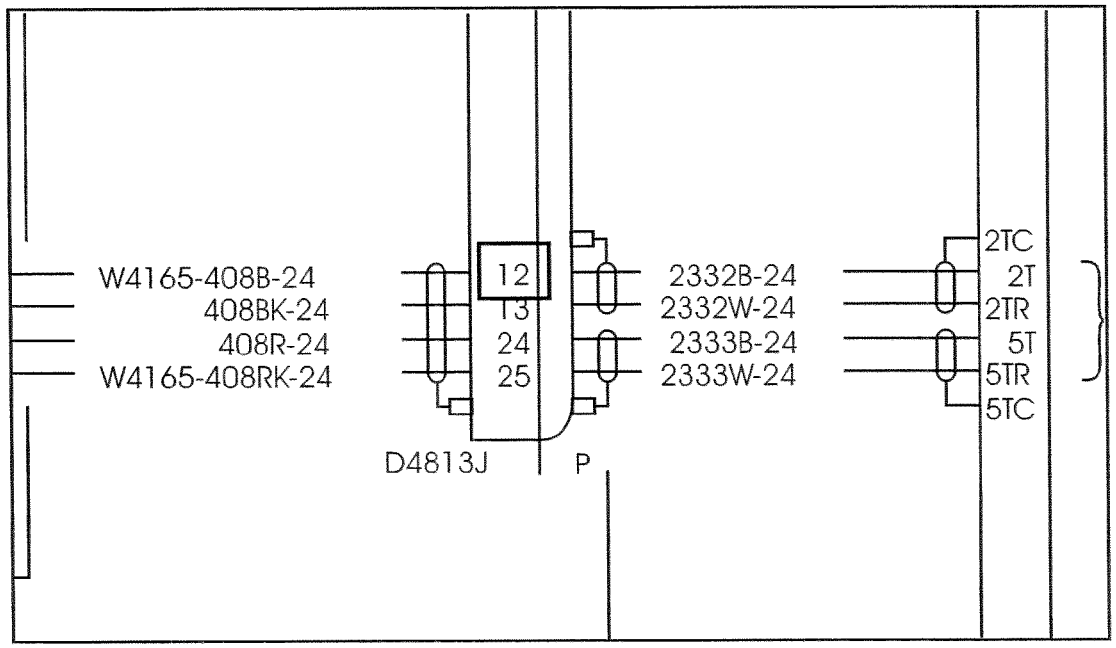
Figure 8C:
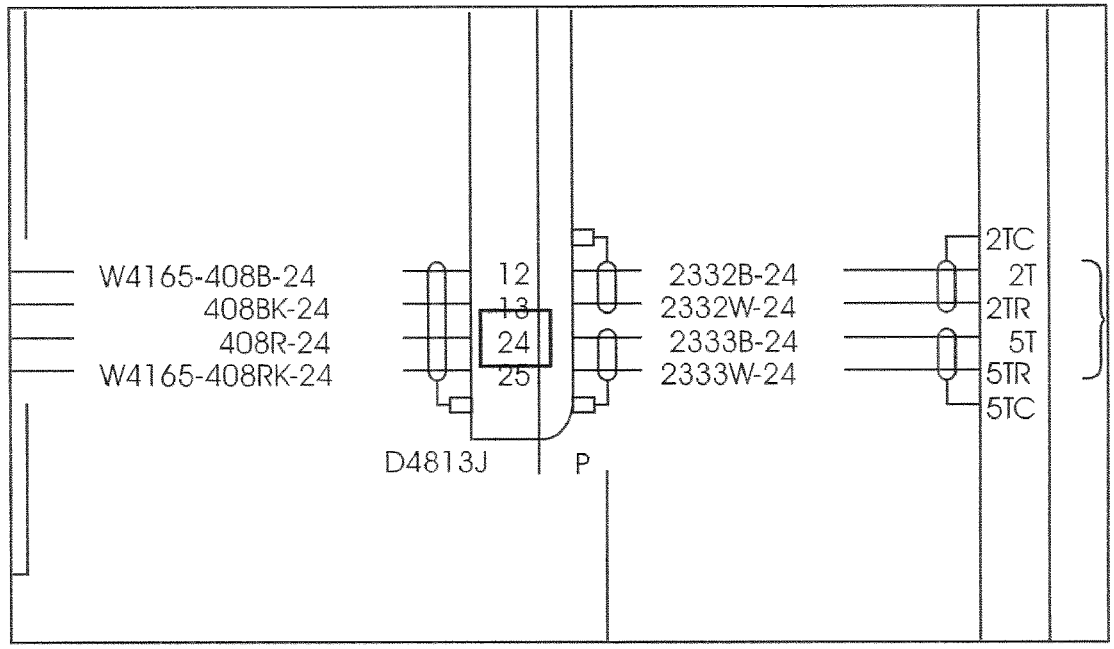

FIGS. 8A-8G show a user navigating on a drawing having a row/column network and highlighting different objects. In FIG. 8A, pin 13 is highlighted. The user can navigate on the schematic in four different directions: up, down, right, and left. Pressing a key on the keyboard associated with the command "up" causes the text reference for pin 12 to be highlighted as it is directly above the text reference for pin 13, as shown in FIG. 8B. If the user presses a key on the keyboard associated with the command "down", the text reference for pin 24 is highlighted as it is directly below the text reference for pin 13, as shown in FIG. 8C.

Figure 8D:
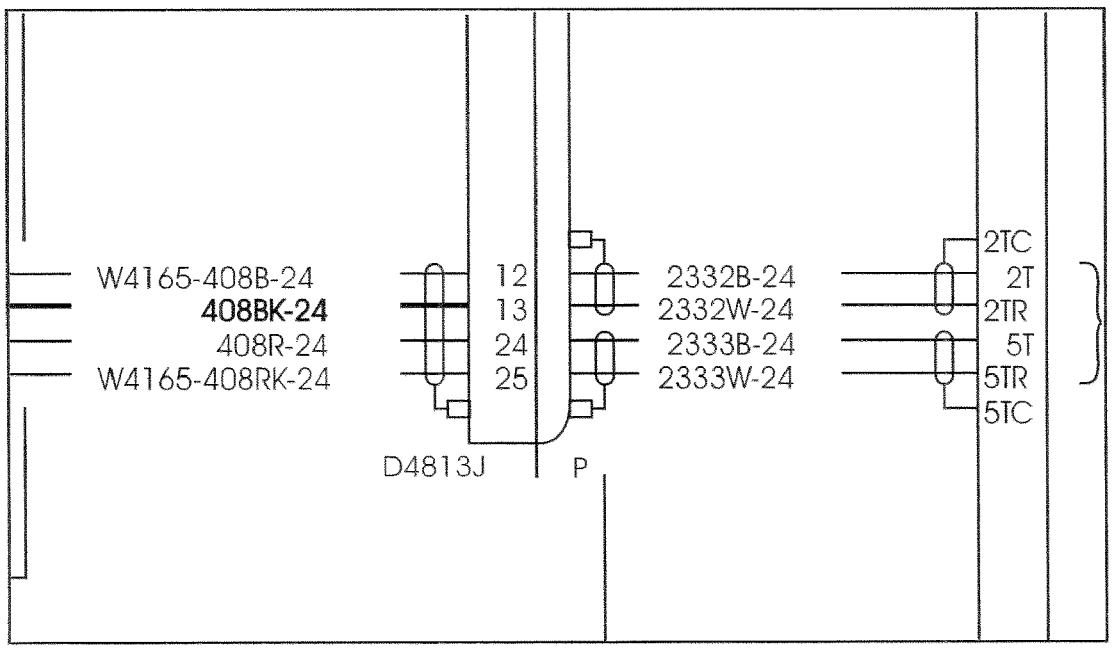
Figure 8E:
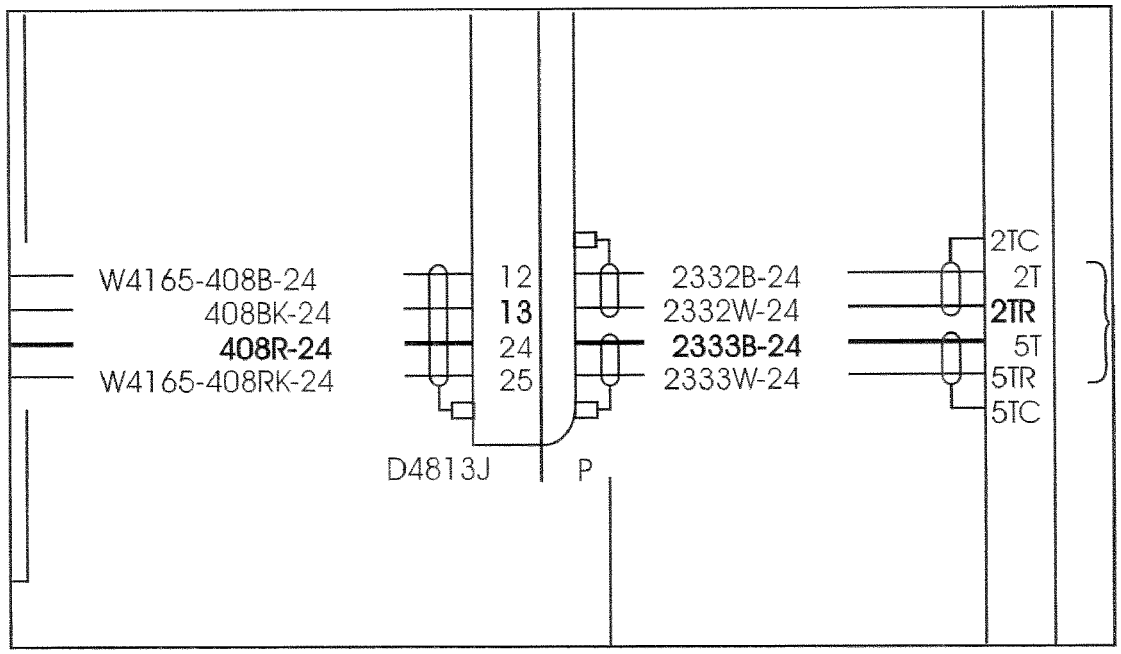
Figure 8F:
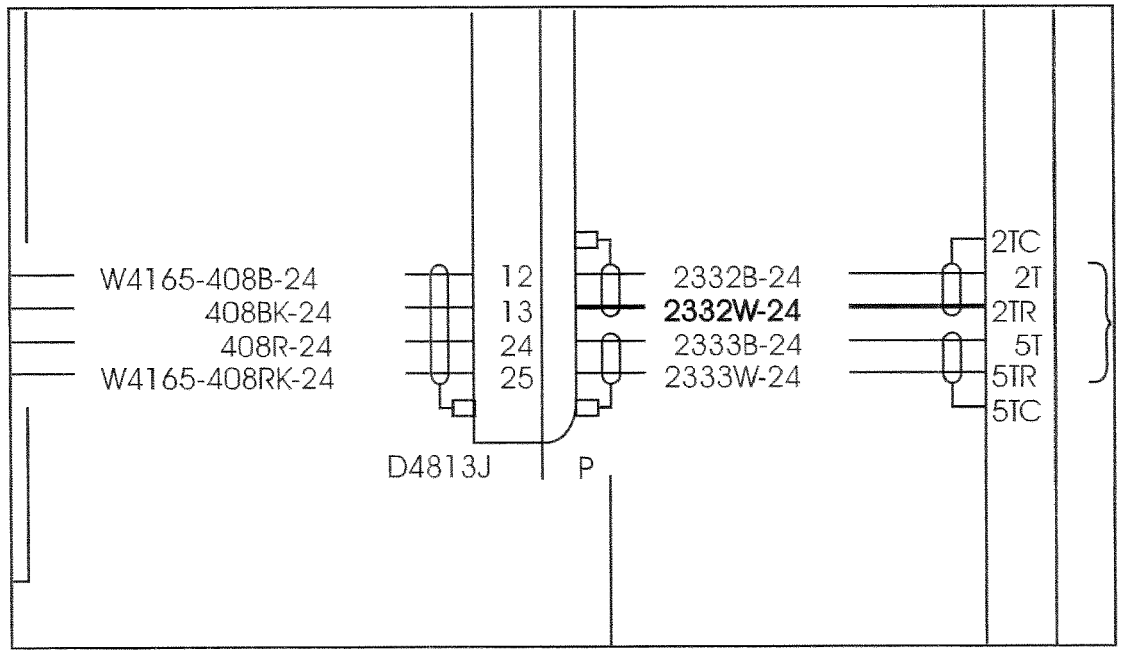
Figure 8G:
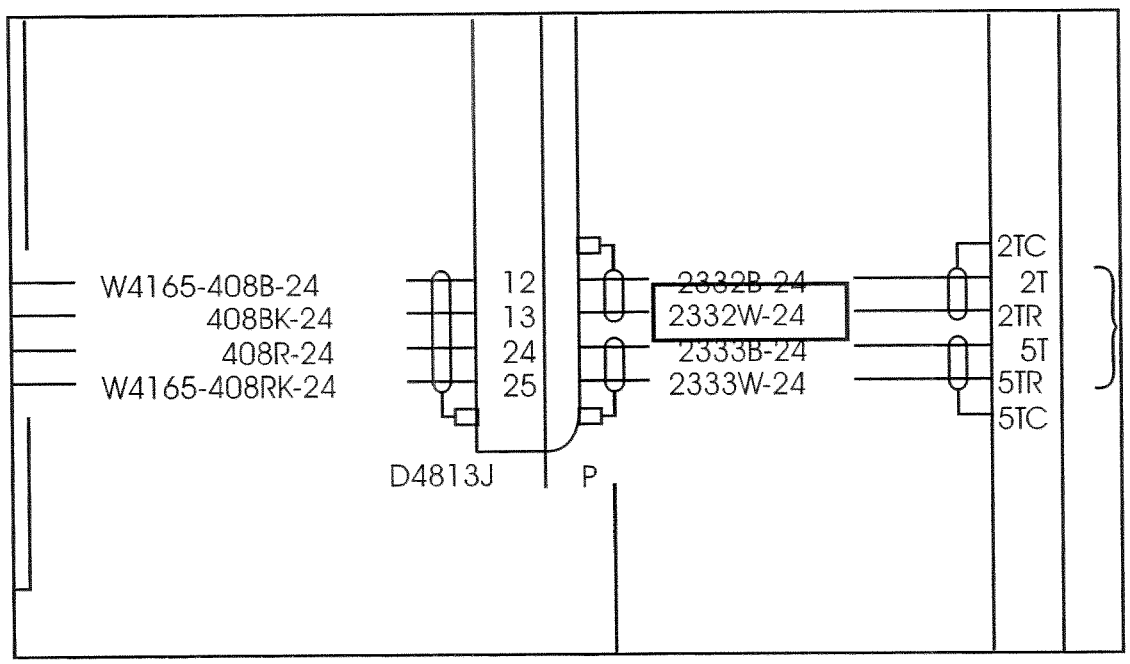

If the user presses a key on the keyboard associated with the command "left", a wire is highlighted. The wire is the next logical object to the left in the row where the text reference for pin 13 is located, as shown in FIG. 8D. If the user presses a key on the keyboard associated with the command "select", the circuit path for the wire is highlighted as shown in FIG. 8E. If the user presses a key on the keyboard associated with the command "right", a wire is highlighted. The wire is the next logical object to the right in the row where the text reference for pin 13 is located, as shown in FIG. 8F. If the user presses a key on the keyboard associated with the command "right" while on the wire of FIG. 8F, a text reference for this wire is then highlighted, as shown in FIG. 8G. The wire is the next logical object to the right in this row, since it was reached from the left. Navigating to the right again causes the same wire to be highlighted again as shown in FIG. 8E. Navigating again to the right highlights pin 2TR.

If the user navigates off the edge of a drawing, the next object is selected by wrapping around to the next logical row or column. For example, navigating to the right off the edge of a drawing results in the left most object in the row below to be selected. Navigating to the left off the edge of a drawing results in the right-most object in the row above being selected. Navigating down off the edge of a drawing results in the top-most object in the next column to the right being selected. Navigating up off the edge of a drawing results in the bottom-most object in the previous column to the left being selected.

Figure 9A:
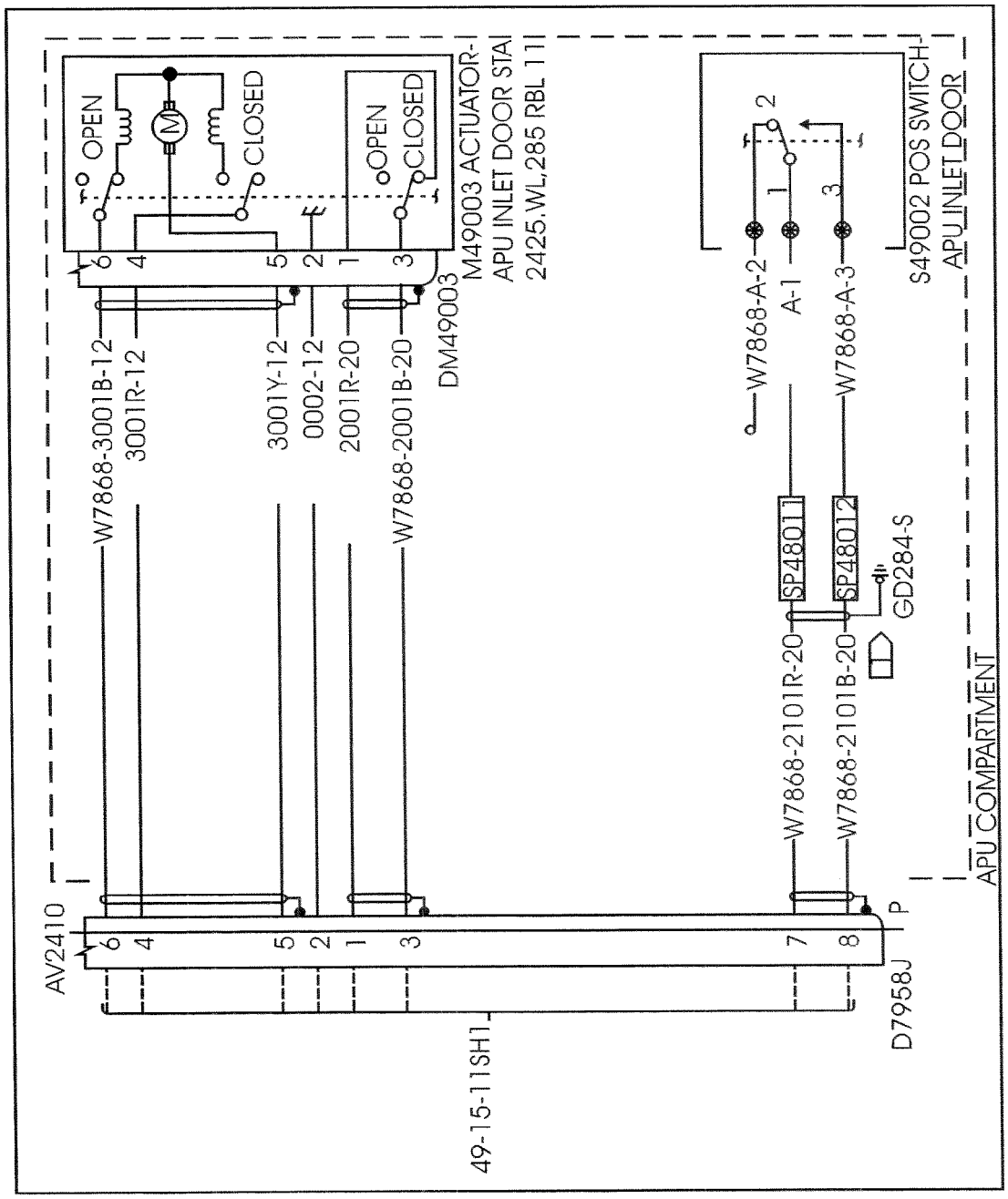
FIGS. 9A-9C show an example of building a simple row and column network for a wiring diagram, according to one aspect of the present invention.
Figure 9B:
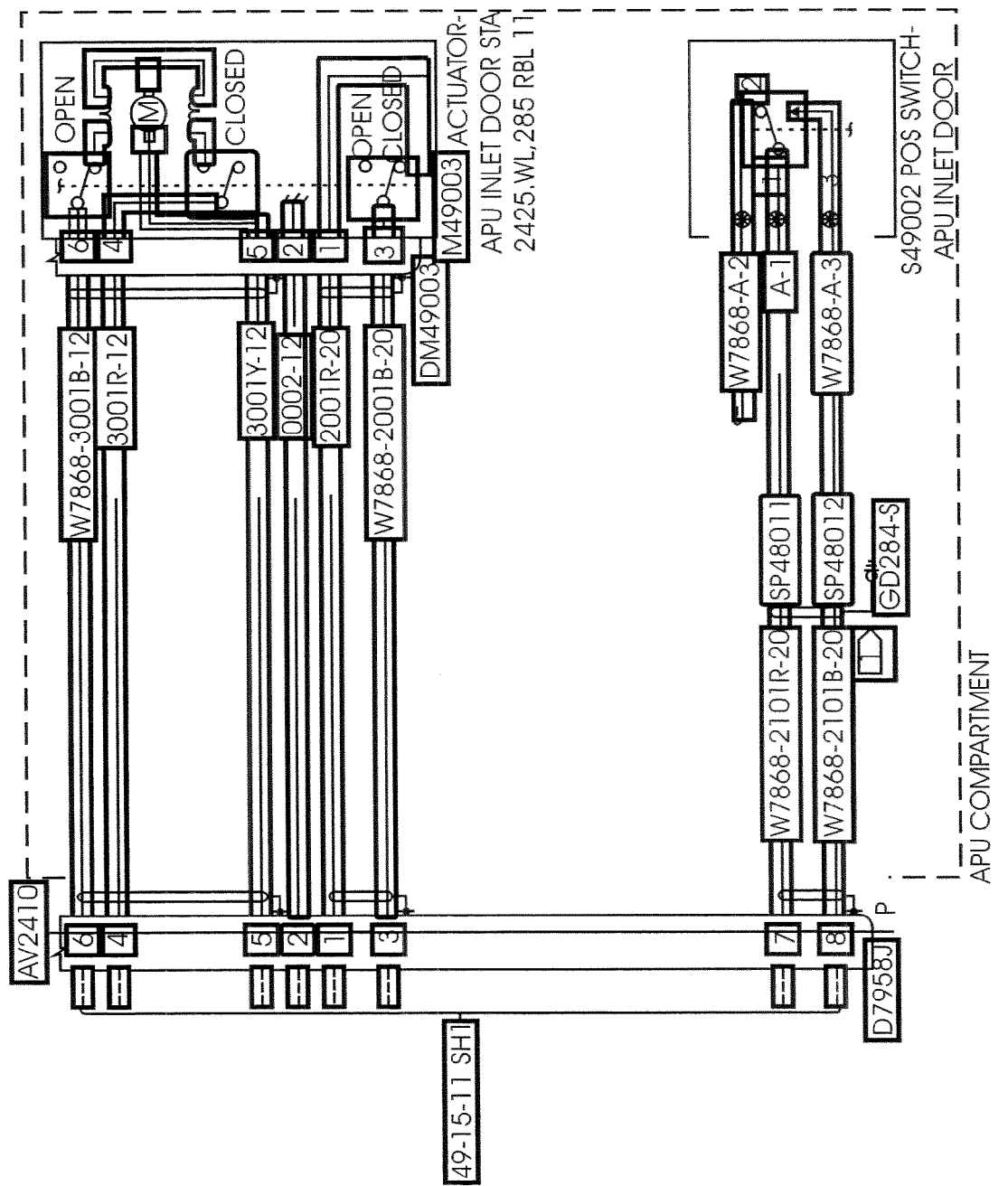
Figure 9C:
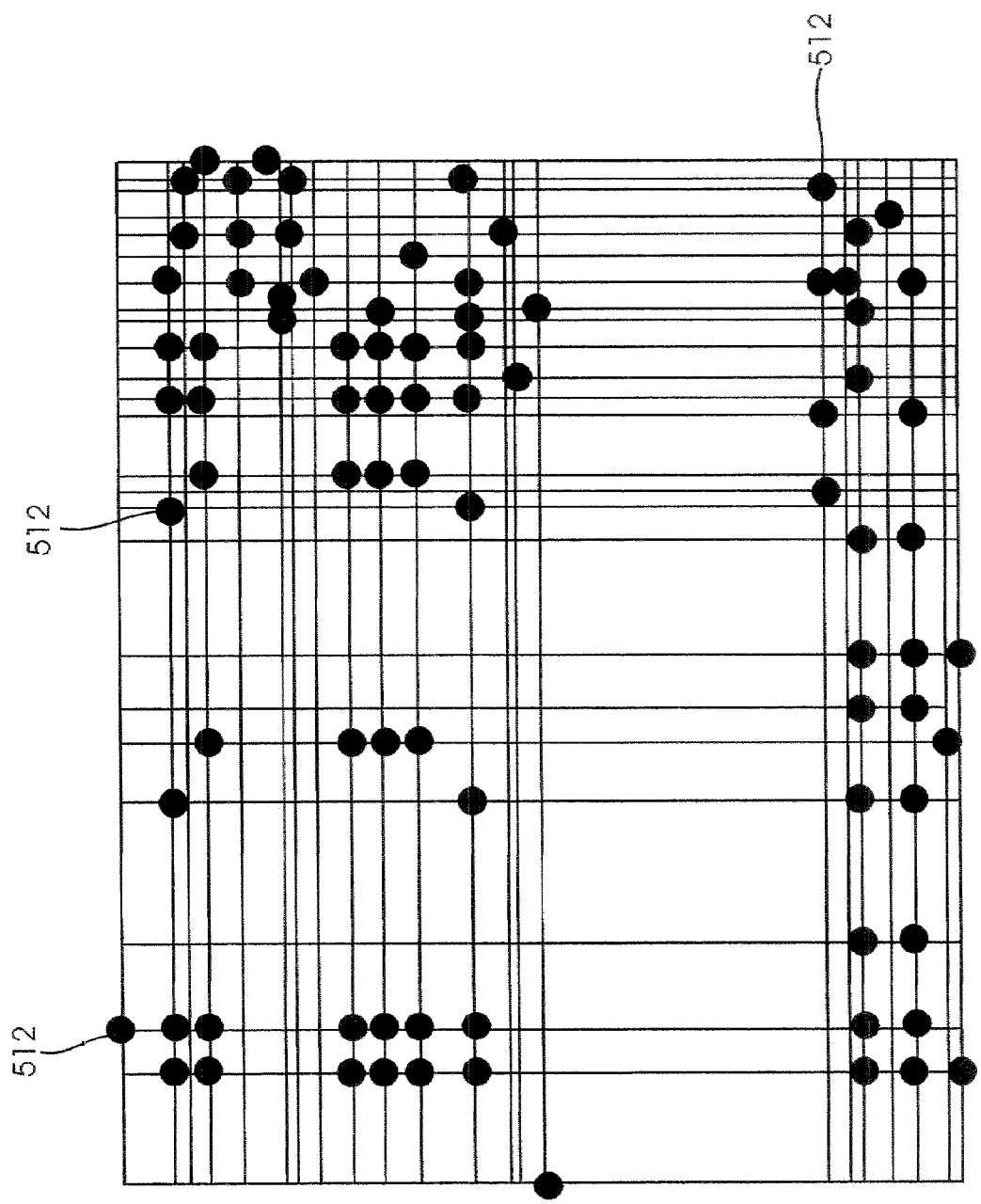

FIGS. 9A-9C show an example of building a simple row and column network for a wiring diagram, according to one aspect of the present invention. First, as shown in FIG. 9A, a wiring diagram containing embedded objects is utilized and FIG. 9B shows the embedded objects in the wiring diagram such as wires, text references, off-sheet references, and electrical components. Next as shown in FIG. 9C, a center 512 is computed for each object; for wires a center is computed for each segment. Then rows and columns are formed using the centers 512. If an object is within a small distance of another row or column it is included in that row or column. Movement through the network then proceeds as described above, from object to object in a given row or column.

Figure 10A:
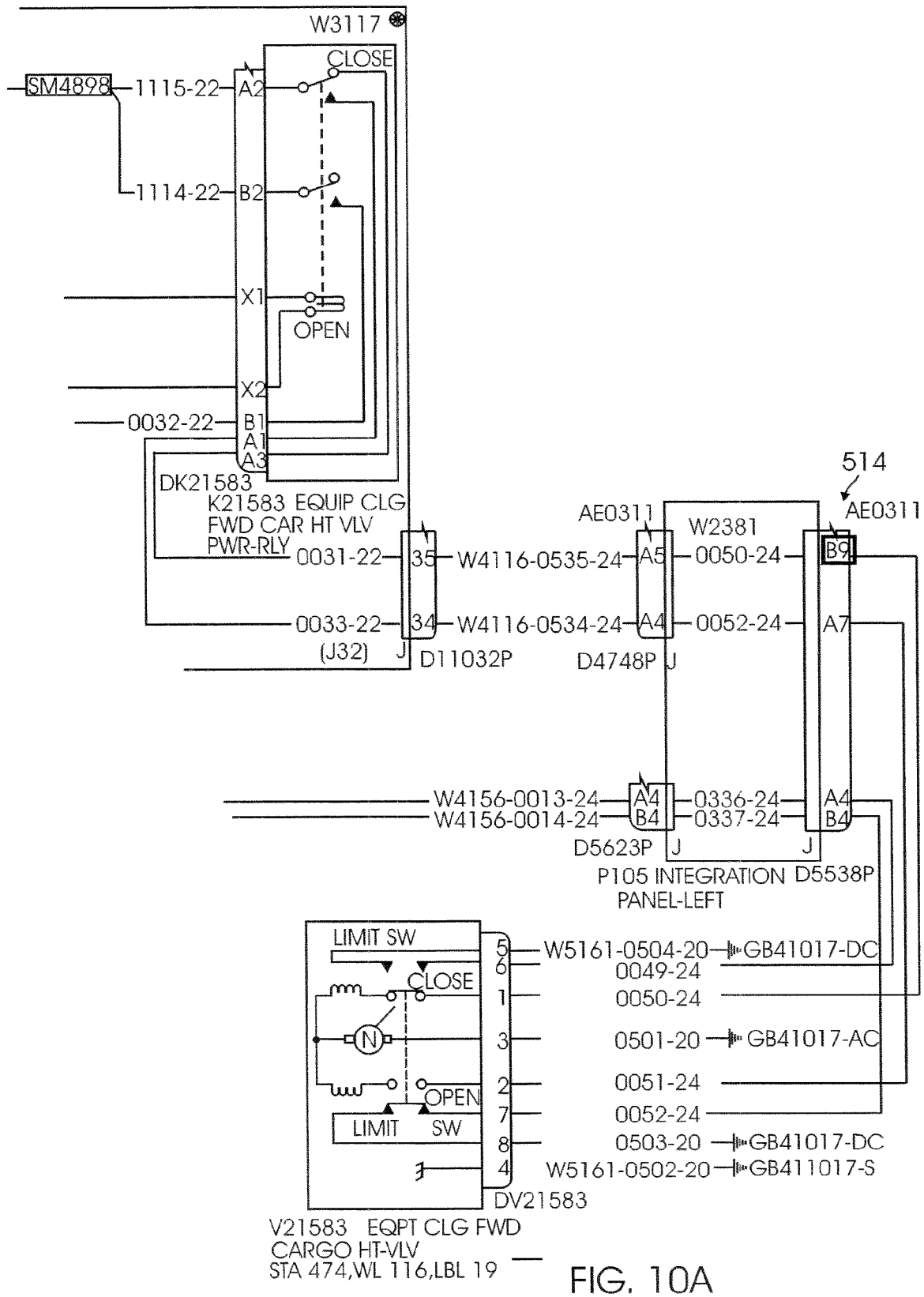
FIGS. 10A-10D show an example of navigating near the edge of a drawing, according to one aspect of the present invention.
Figure 10B:
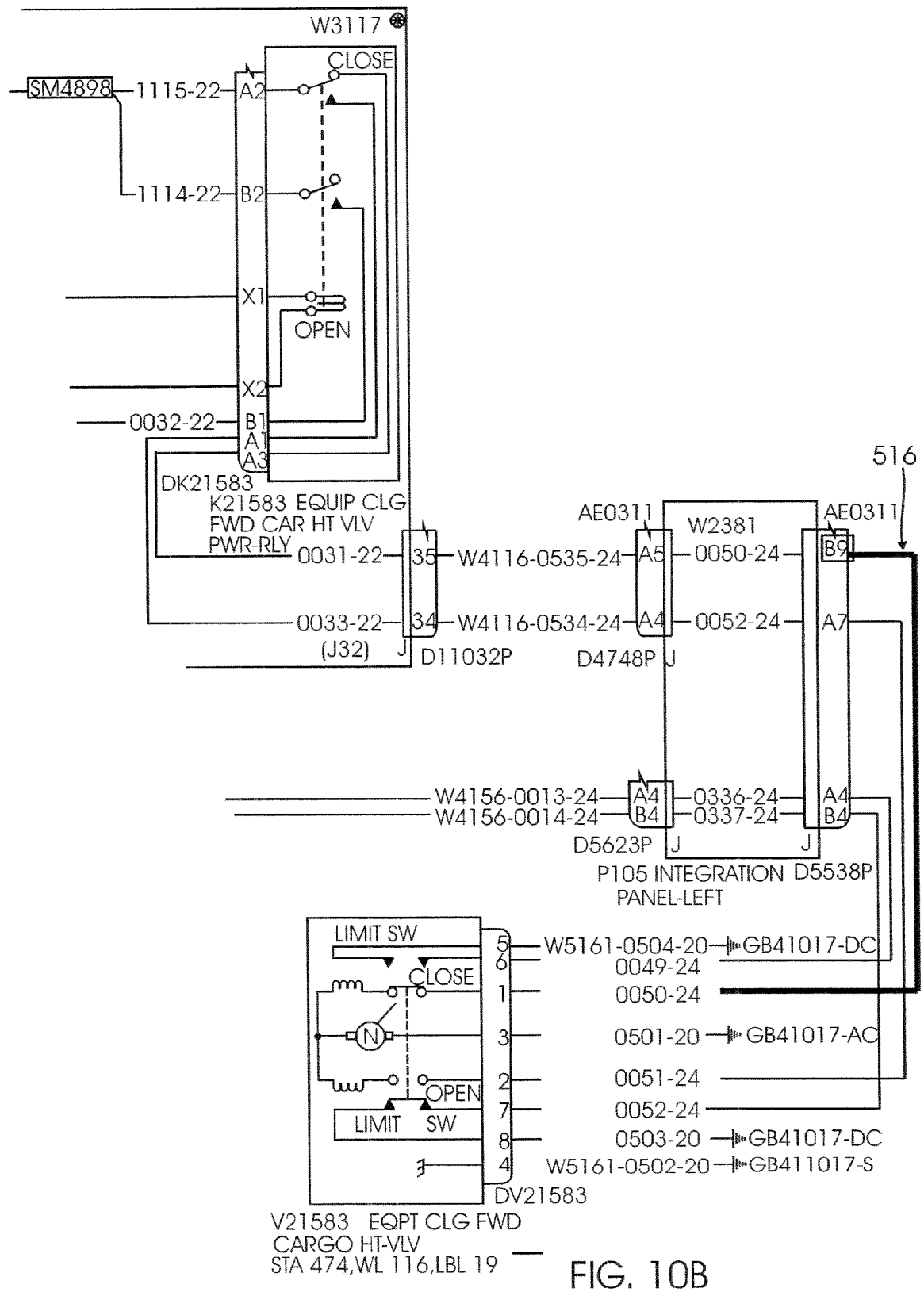
Figure 10C:
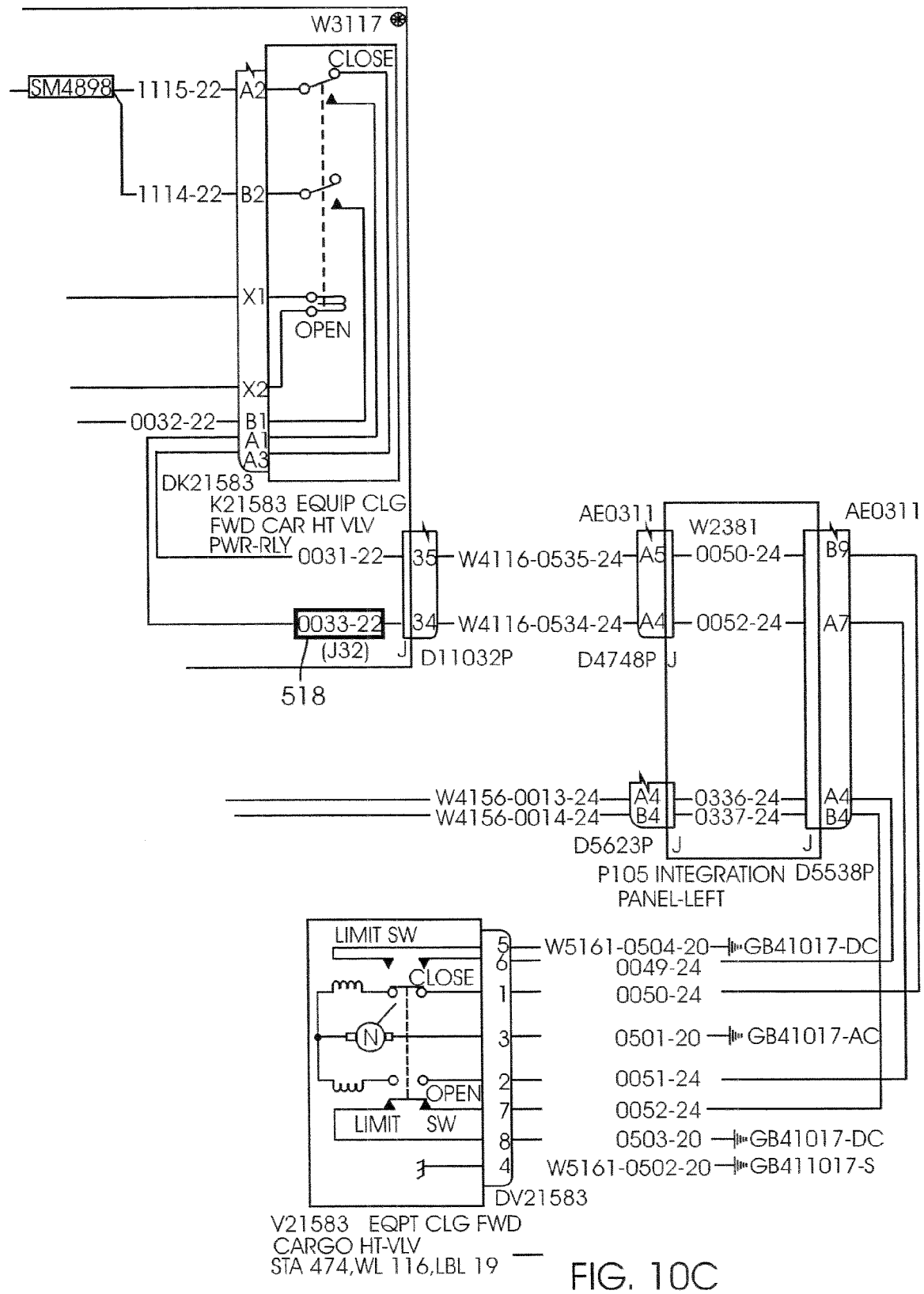
Figure 10D:
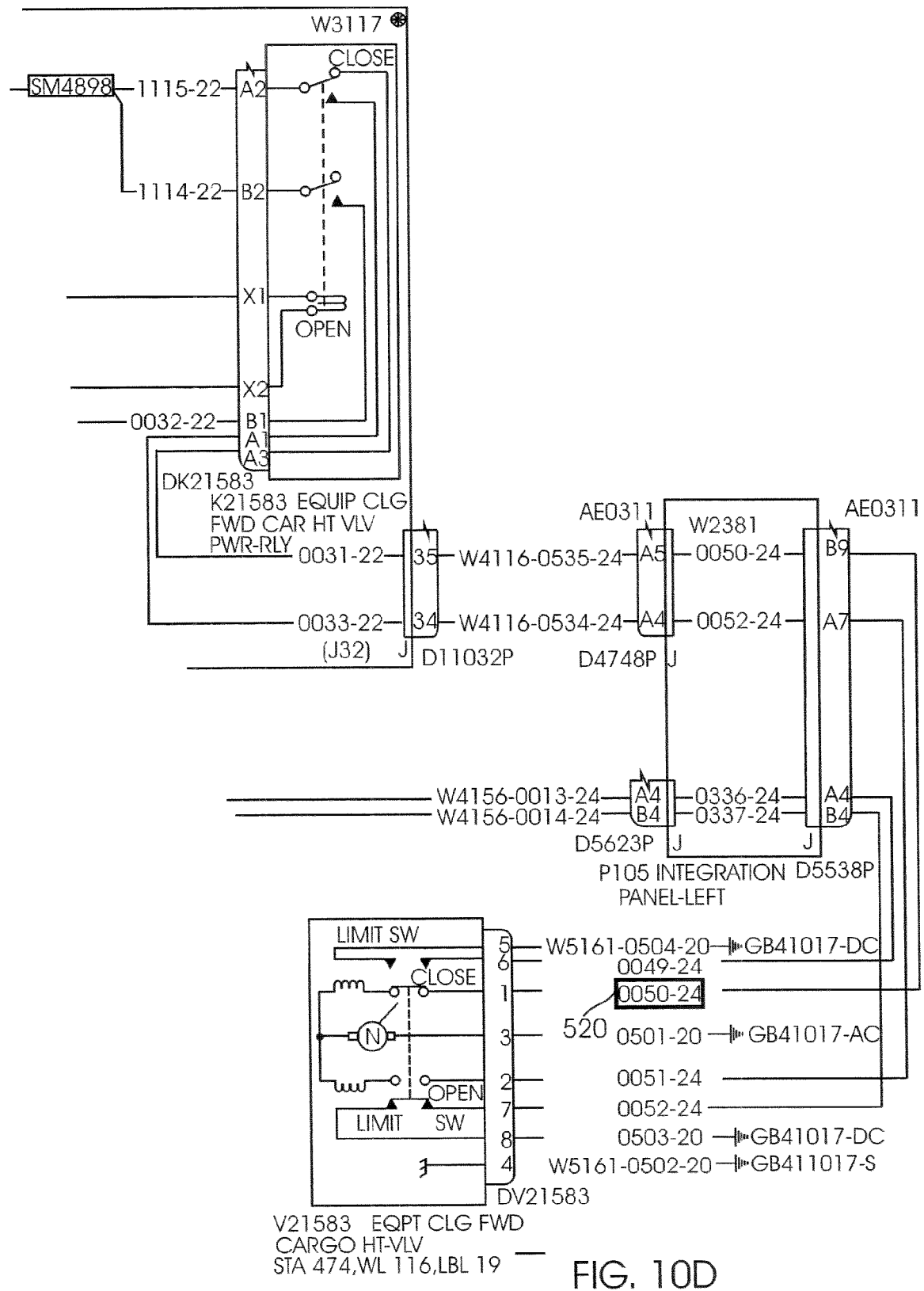

FIGS. 10A-10D show an example of navigating near the edge of a drawing, according to one aspect of the present invention. FIG. 10A shows a wiring diagram with a pin highlighted near the edge of the drawing. If the user presses a key on the keyboard associated with the command "right" while on the highlighted pin 514, the object to the immediate right of pin 514 is highlighted, a wire 516, as shown in FIG. 10B. If navigation is solely using a simple row and column network, the next "right" results in the first object in the next row 518 being selected, as shown in FIG. 10C. FIG. 10D shows that navigating using a more sophisticated "circuit-continuity-following" method results in following the wire to the next object 520 in the circuit. For many tasks, following the circuit will be much more useful than simply going to the left-most object in the next row. A similar method can be applied to navigate through hydraulic or pneumatic flows in schematic drawings. The method for building the network is similar to the method for building a simple row and column network. Centers of objects are computed as before. Electrical connectivity is used to connect objects in the network instead of row and column organization. After electrical links are made, other links are filled in using rows and columns as above.

Figure 11A:
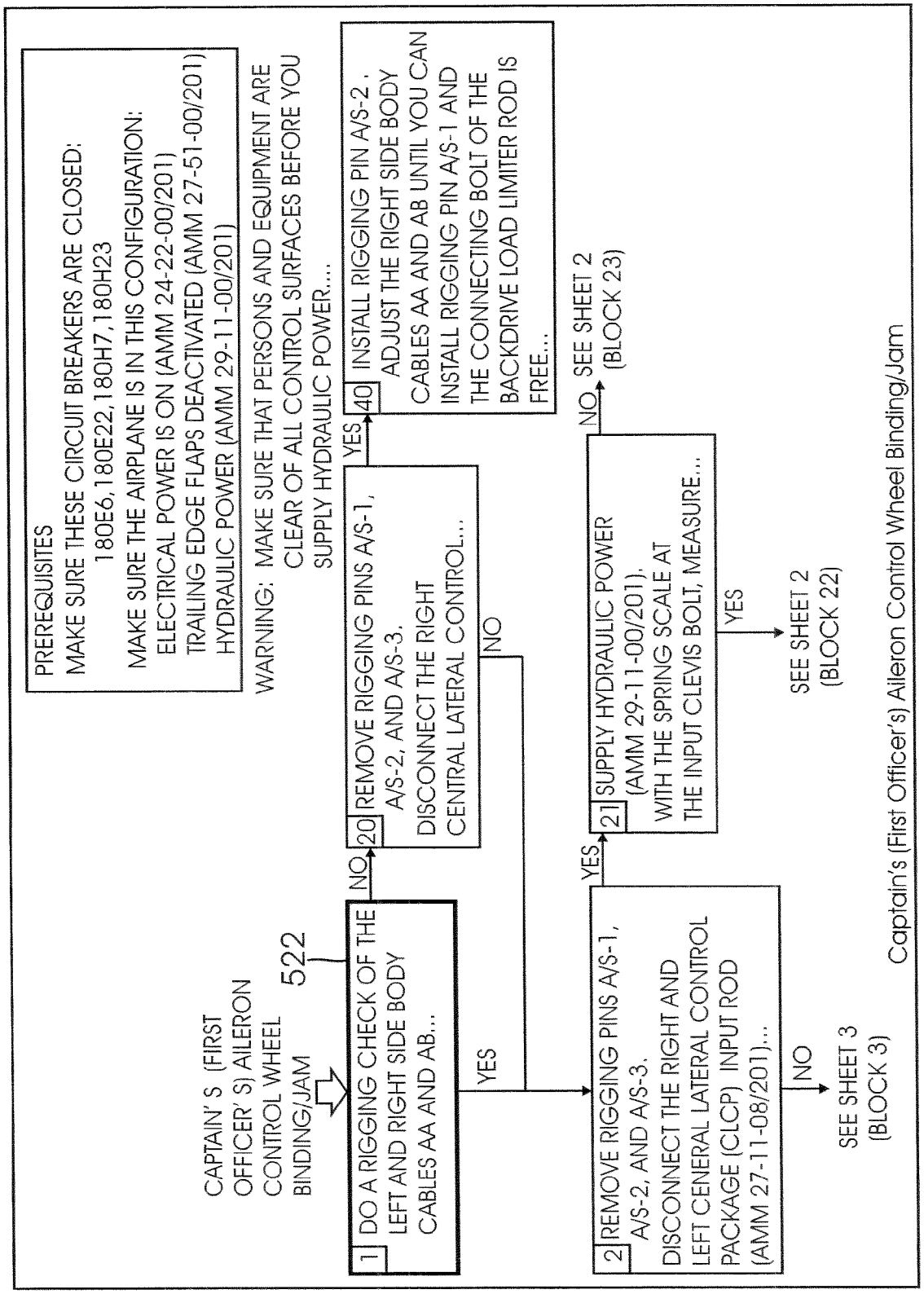
Figure 11B:
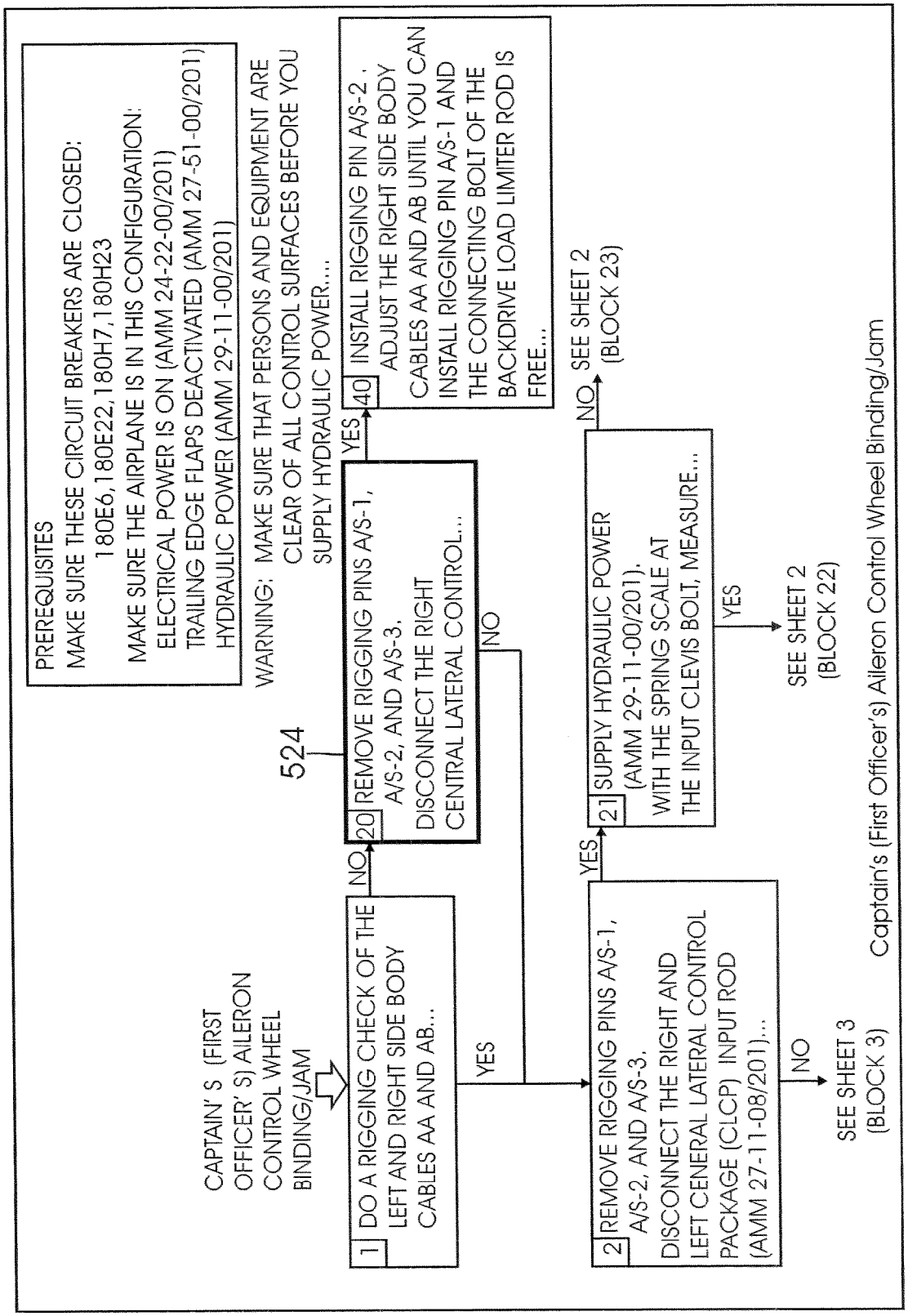
Figure 11C:
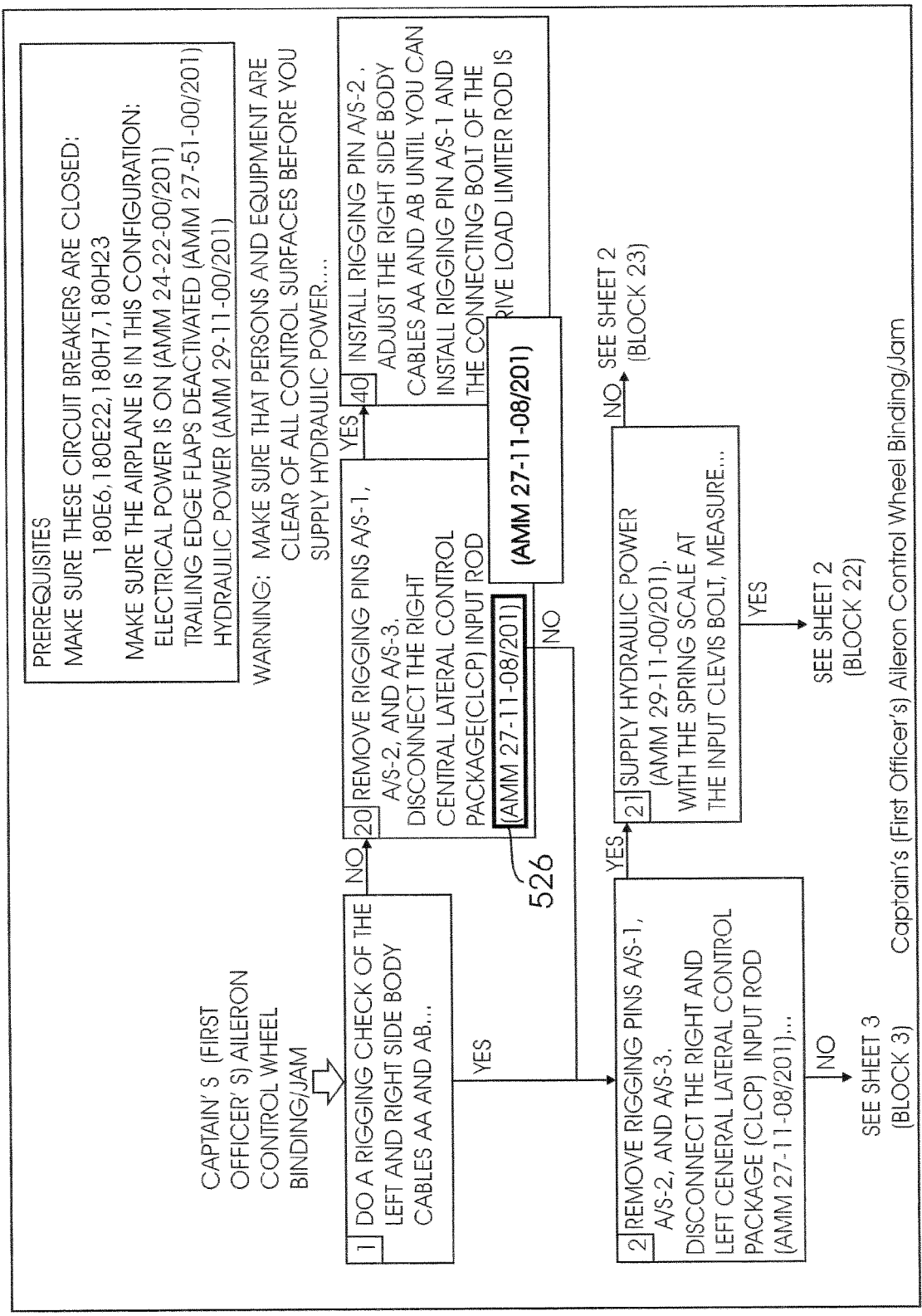

FIGS. 11A-11D show an example of navigating objects in a diagnostic flow chart, according to one aspect of the present invention. Objects in a diagnostic flow chart can include, but are not limited to, logic blocks, selectable contents of logic blocks such as references to other manuals, answers to diagnostic questions, off-sheet references, and other objects. FIG. 11A shows a diagnostic flow chart of a fault isolation manual. The flow chart comprises logic blocks that contain questions; the answers to the questions point the user to subsequent logic blocks. A logic tree may span many pages and even several volumes of the manual, and eventually may lead the user to another manual for repair, replacement, or further diagnosis. In FIG. 11A, the user has navigated to a first logic block 522. Using simple row and column logic, the user can move right from first logic block 522 to the text answer, "No" causing a second logic block 524 to be highlighted, as shown in FIG. 11B. However, the system and method of the present invention knows the logical connections among objects and can make a better navigation choice. When the user moves Right, logic block 20 (or second logic block 524) is chosen. When the user selects a logic block, such as second logic block 524, the first navigable object 526 in block 524 is highlighted, as shown in FIG. 11C. Navigating down in block 524 causes the next navigable object 528 to be highlighted, as shown in FIG. 11D.

FIG. 12 (FIGS. 12A-12B) is an example of a table where the objects are arranged in a row and column network capable of navigation.

Figure 13A:
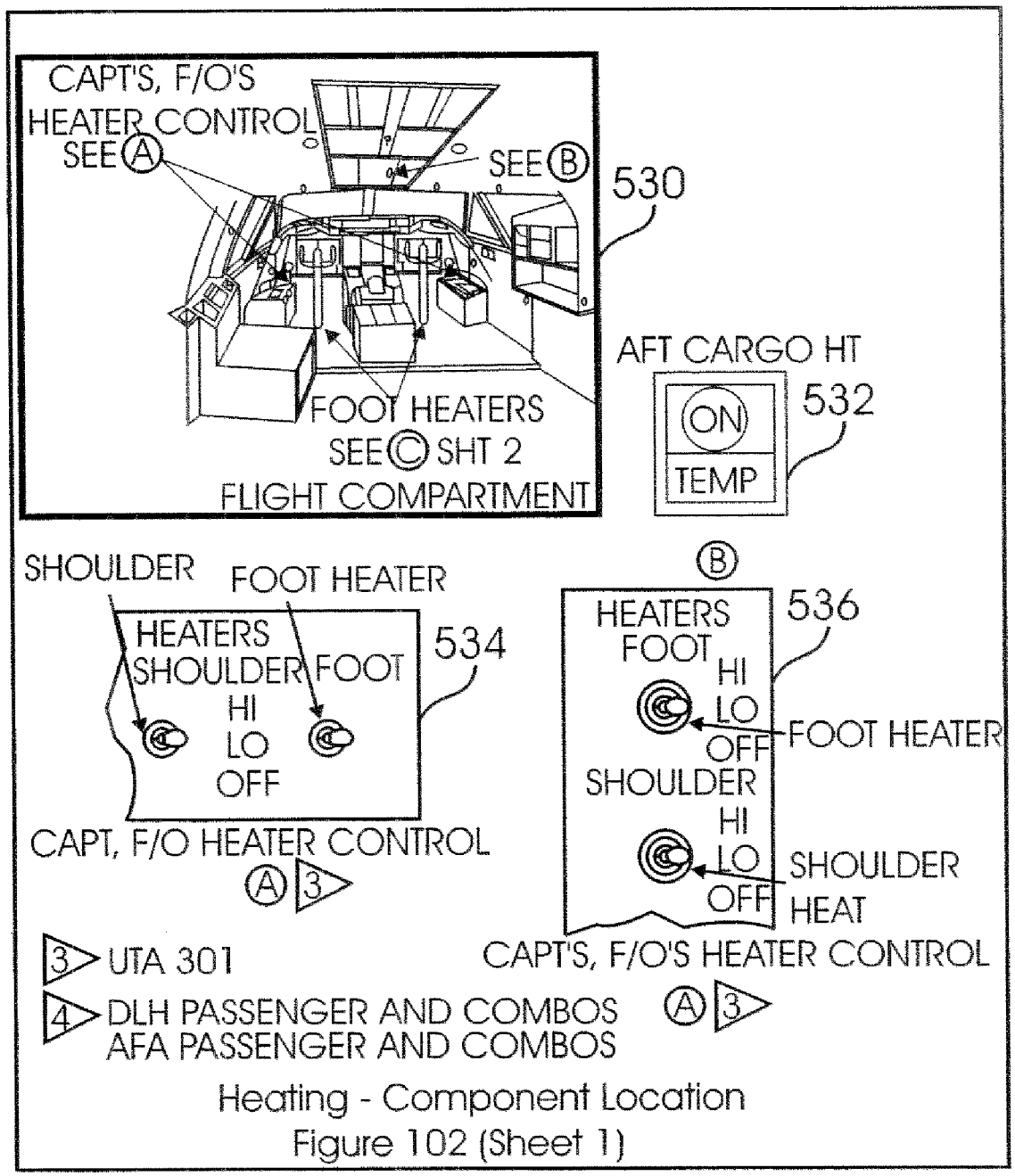
FIGS. 13A-13E show an example of using the system and method of the present invention on component location drawing navigation networks.
Figure 13B:
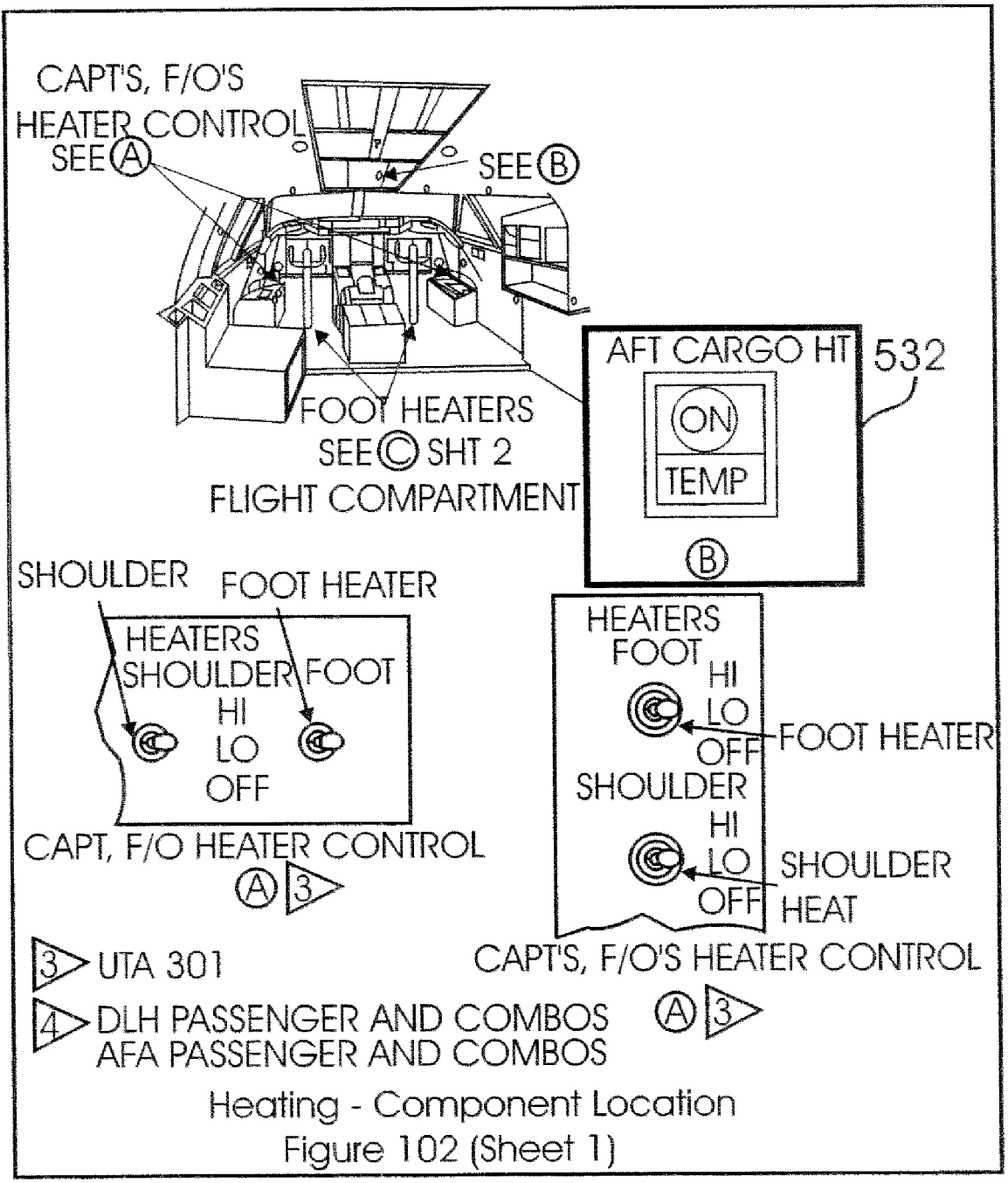
Figure 13C:
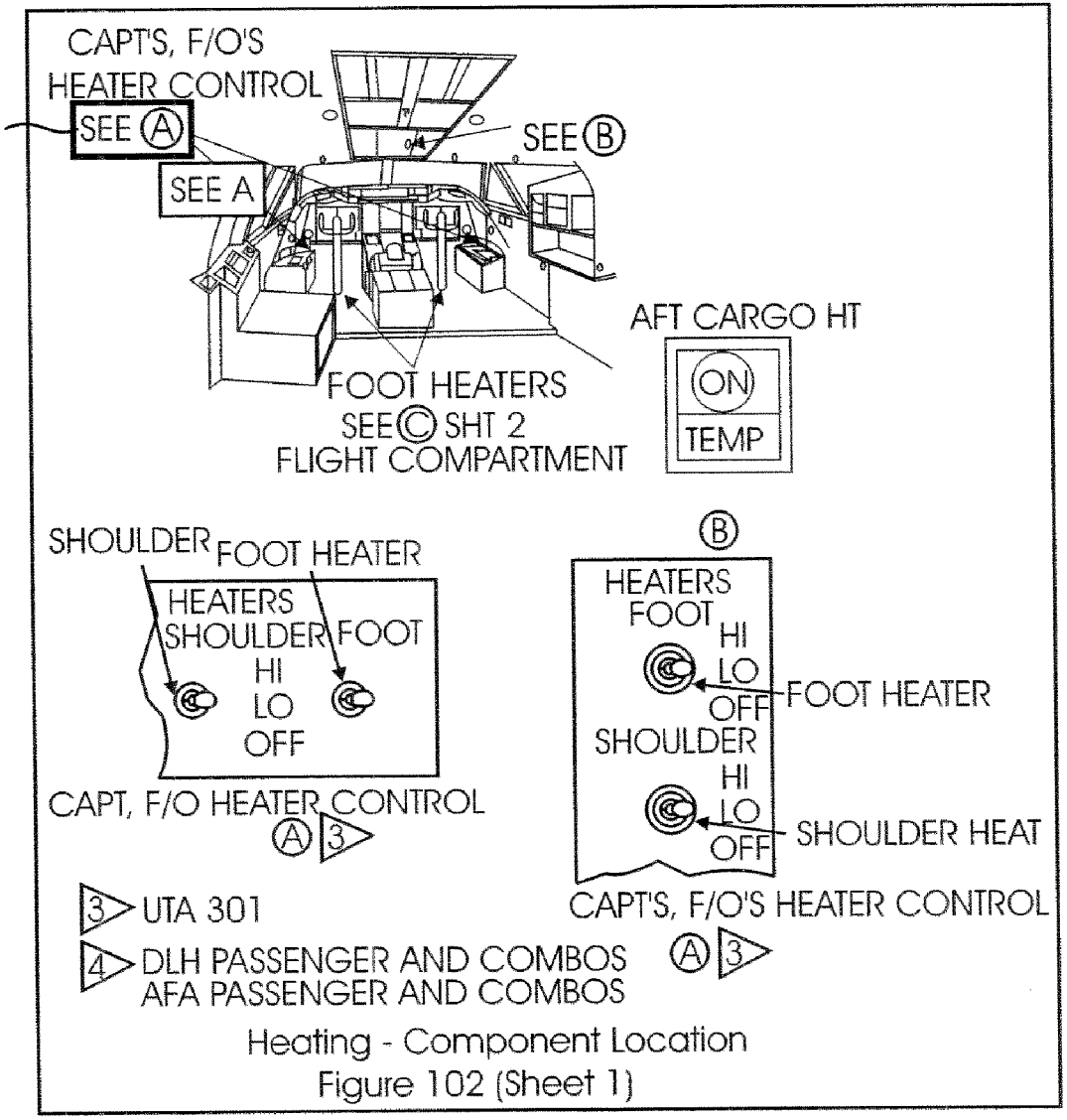
Figure 13E:
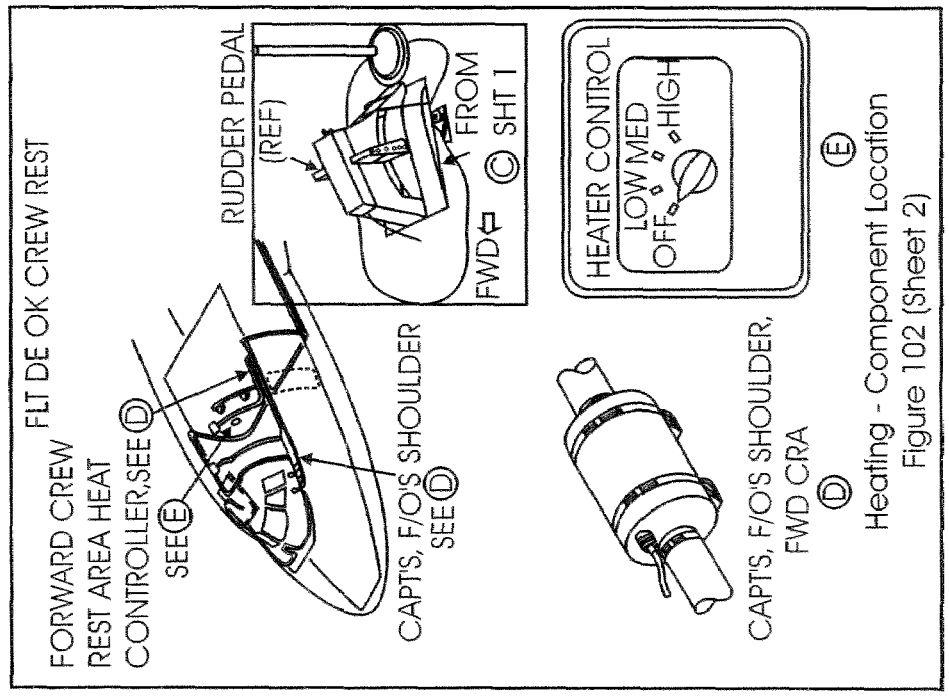
Figure 13D:
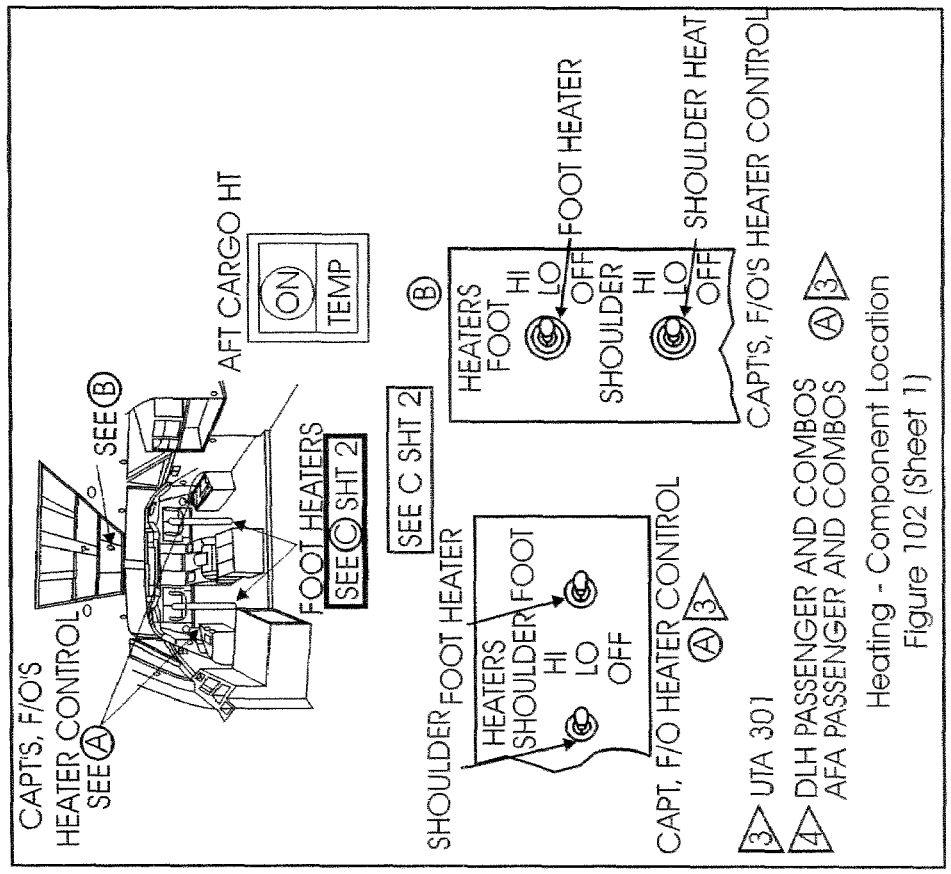

FIGS. 13A-13E show an example of using the system and method of the present invention on component location drawing navigation networks. As shown in FIG. 13A, navigation occurs amongst four component locations 530-536. To go from the first component location 530 to the second component location 532, the user navigates to the right as shown in FIG. 13B. If the user selects a component location, such as first component location 530, the first navigable object 538 in the location is highlighted as shown in FIG. 13C. FIG. 13D shows an example of the user selecting an off-sheet reference to a detail; the system navigates to and chooses the detail on a separate drawing as shown in FIG. 13E.

Figure 14A:
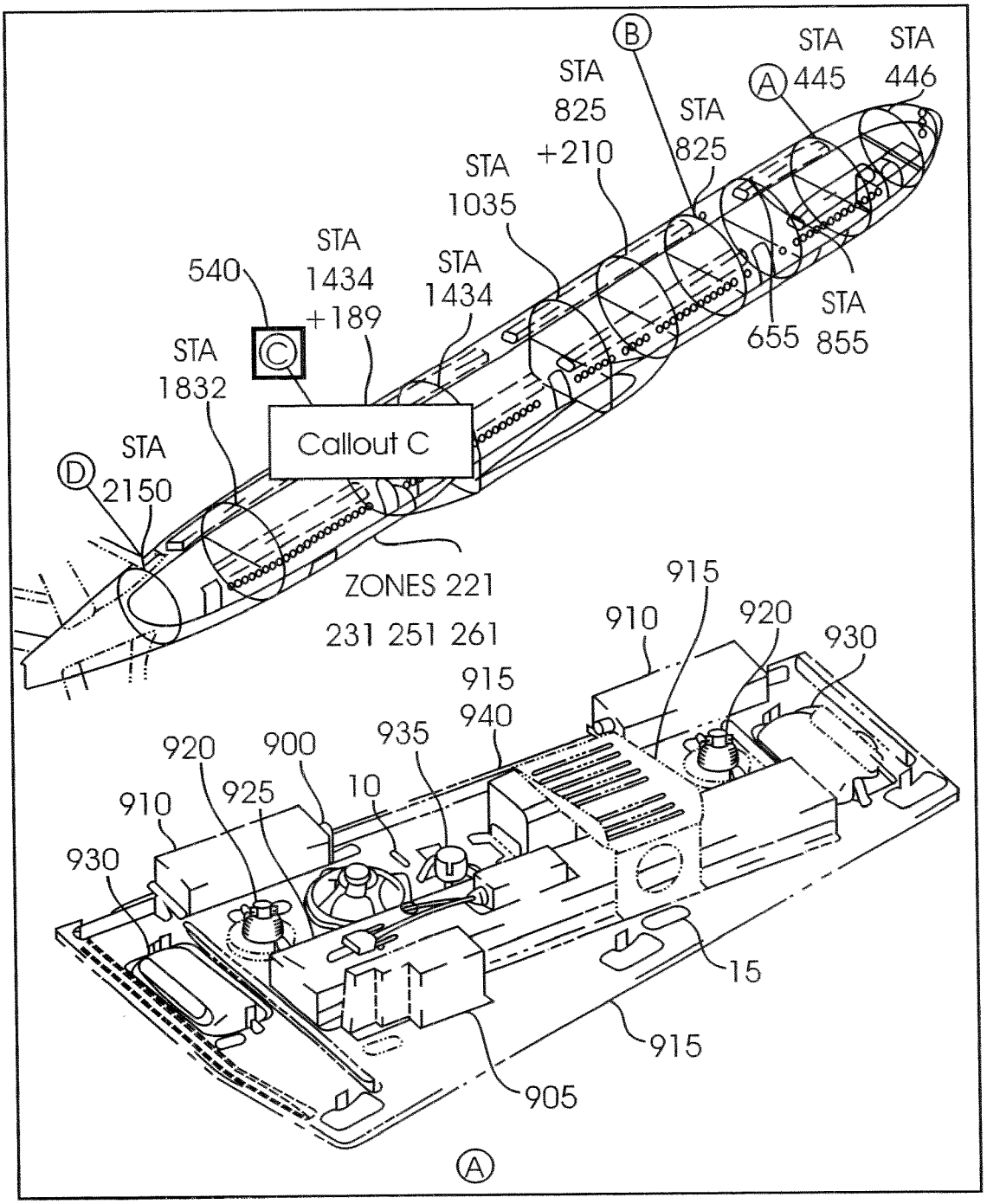
FIGS. 14A-14E show an example of using the system and method of the present invention to navigate on parts pages and exploded views.
Figure 14C:
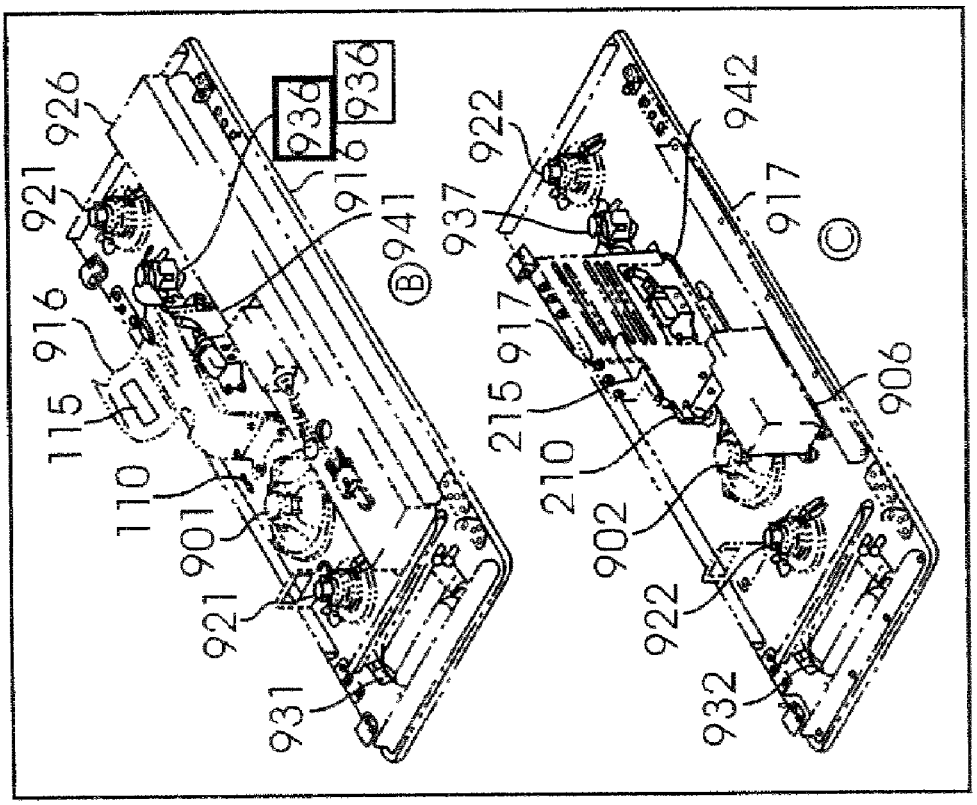
Figure 14B:
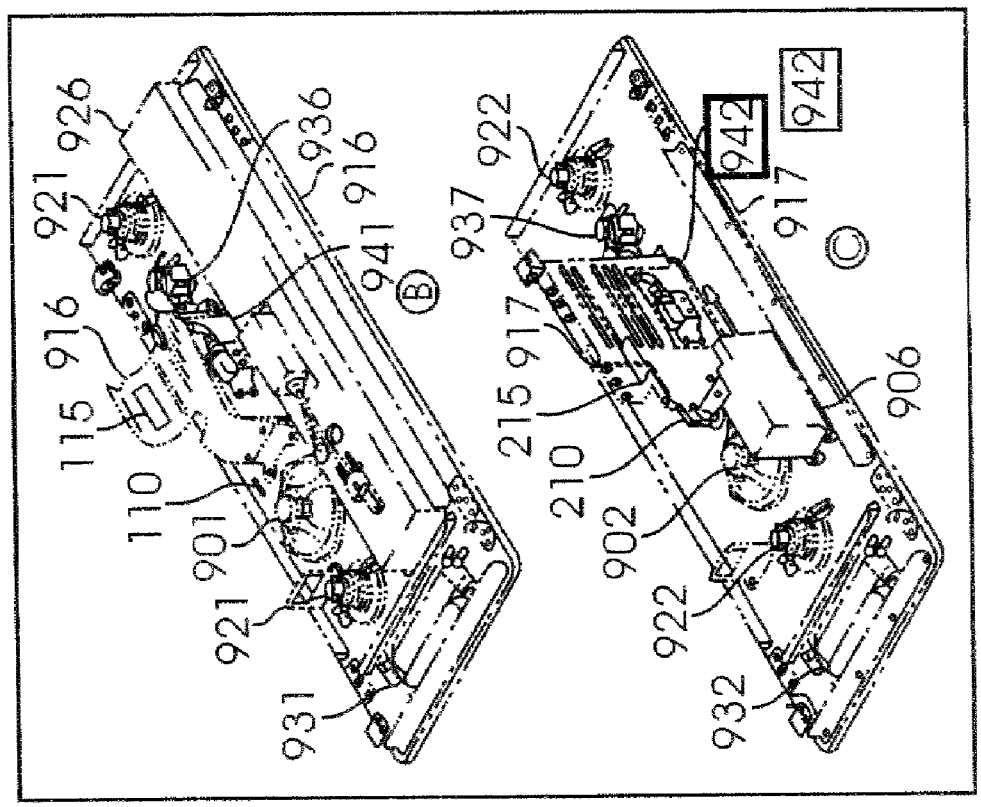
Figure 14E:
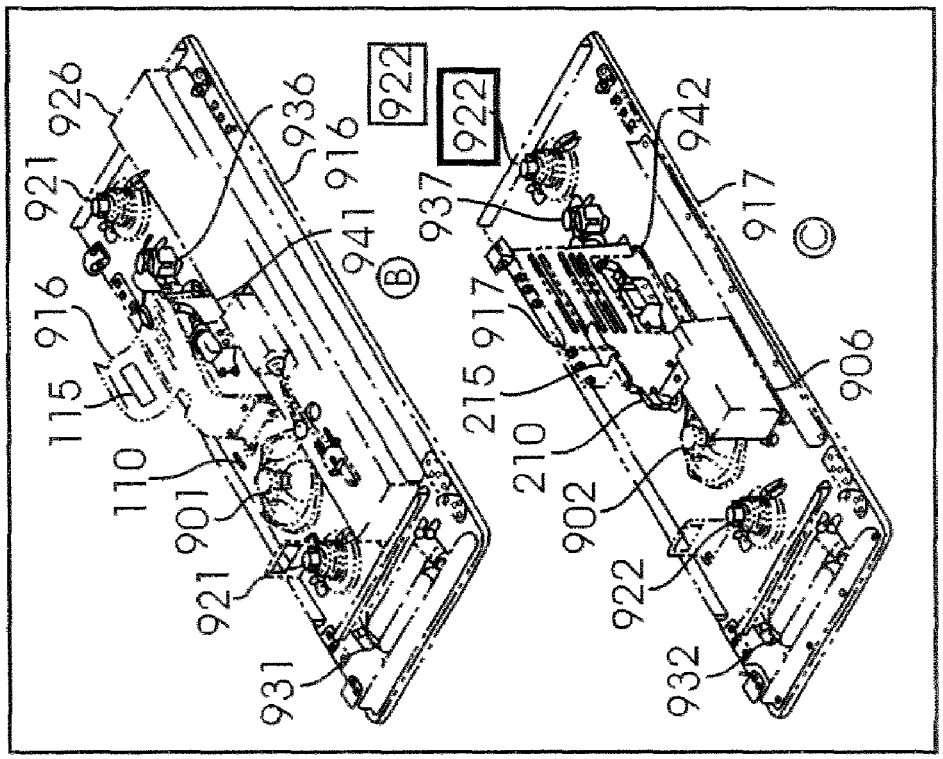
Figure 14D:
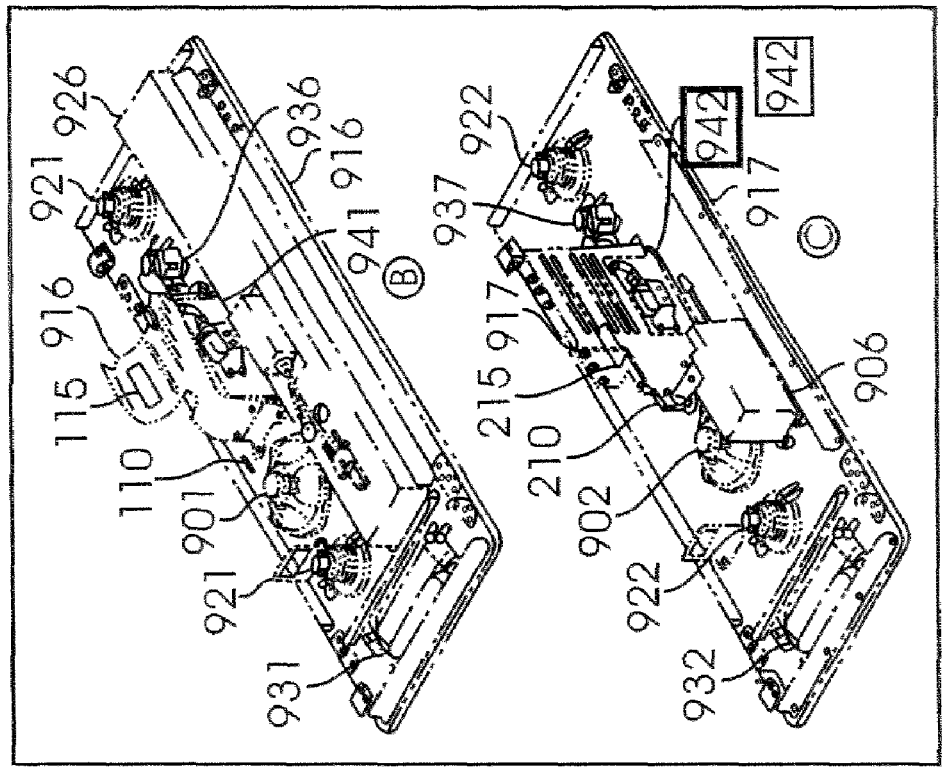

FIGS. 14A-14E show an example of using the system and method of the present invention to navigate on parts pages and exploded views. Drawing objects include, but are not limited to, callouts, details, item numbers, zones, and stations. FIG. 14A shows selecting callout C 540 causing the system to navigate to callout C 540. FIG. 14B shows the ability to enhance parts page navigation by going beyond simple row and column linkage. For example, if using simple row and column linkage in FIG. 14C and moving up from item 942 will lead to item 936 in FIG. 14C. As shown in FIGS. 14D and 14E, task-based linkage can be used to navigate to items around the current detail. Here the user enters Up, Left, and Left, to navigate to items around the current detail.

In an additional embodiment of the present invention, auto-zooming can be used. This can be very useful while performing certain tasks, especially on devices with small form factors.

In summary, object-based navigation provides a rapid, pointer (e.g. mouse, touch pad, joystick) free method for navigating complex technical drawings. The general row and column network can be applied to any drawing. Even more efficient networks can be created based on specialized knowledge of the content of particular classes of drawings.

While the present invention is described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method comprising:
loading, using a physical processor, a drawing having a number of drawing objects and associated object data, wherein the associated object data describes relationships between the number of drawing objects;
arranging, using the physical processor, the drawing and the associated object data into a first type of navigation network and a second type of navigation network, wherein the first type of navigation network comprises a first plurality of parameters used to interact with the drawing, and wherein the second type of navigation network comprises a second plurality of parameters used to interact with the drawing, and wherein the first plurality is different than the second plurality;
selecting one of the first type of navigation network and the second type of navigation network, wherein a selected navigation network is formed;
displaying, on a display, the drawing using the selected navigation network;
mapping, using the physical processor, a key of a keyboard to one of a first mapping and a second mapping, wherein the first mapping comprises the key being mapped to a first command usable in the first type of navigation network, wherein the second mapping comprises the key being mapped to a second command usable in the second type of navigation network, wherein the key is mapped to the first mapping when the selected navigation network is the first type of navigation network, wherein the key is mapped to the second mapping when the selected navigation network is the second type of navigation network, and wherein the first mapping and the second mapping are different;
manipulating the drawing using the key;
selecting a drawing object from the number of drawing object to view details of the drawing objects; and
wherein the number of drawing objects include wires, text references, off-sheet references, and selectable components.

2. The method of claim 1, wherein the first plurality of parameters and the second plurality of parameters include keyboard command mapping, navigation method, and object filtering.

3. The method of claim 1, wherein the selected navigation network is the first navigation network, and wherein the method further comprises:
receiving a command to switch to the second navigation network;
response to receiving the command, switching to the second navigation network; and
responsive to switching to the second navigation network, automatically switching from the first mapping to the second mapping.

4. The method of claim 1 further comprising:
arranging the drawing into a third type of navigation network;
switching to the third type of navigation network;
displaying on the display the drawing using the third type of navigation network; and
mapping the key to a third mapping comprising the key being mapped to a third command usable in the third type of network, wherein the third command is different than both the first command and the second command.

5. The method of claim 1, wherein the selectable components include switches, pins, and fuses.

6. A system comprising:
a drawing object module configured to collect and store, in a non-transitory computer readable storage medium, a number of drawing objects and associated object data, wherein the associated object data describes relationships between the number of drawing objects;
an object linkage module configured to link the number of drawing objects and the associated object data into a drawing represented in one of a first type of navigation network and a second type of navigation network, wherein the first type of navigation network comprises a first plurality of parameters used to interact with the drawing, and wherein the second type of navigation network comprises a second plurality of parameters used to interact with the drawing, and wherein the first plurality is different than the second plurality;
a user interface configured to receive a selection one of the first type of navigation network and the second type of navigation network, wherein a selected navigation network is formed;
a display configured to display the drawing using the selected navigation network;
a physical processor configured to map a key of a keyboard to one of a first mapping and a second mapping, wherein the first mapping comprises the key being mapped to a first command usable in the first type of navigation network, wherein the second mapping comprises the key being mapped to a second command usable in the second type of navigation network, wherein the key is mapped to the first mapping when the selected navigation network is the first type of navigation network, wherein the key is mapped to the second mapping when the selected navigation network is the second type of navigation network, and wherein the first mapping and the second mapping are different;
wherein the user interface is further configured to manipulate the drawing using the key;
wherein the user interface is further configured to select a drawing object from the number of drawing objects and the display is further configured to view details of the drawing object; and
wherein the number of drawing objects include wires, text references, off-sheet references, and selectable components.

7. The system of claim 6, wherein the first plurality of parameters and the second plurality of parameters include keyboard command mapping, navigation method, and object filtering.

8. The system of claim 6, wherein the selected navigation network is the first navigation network, and wherein the user interface is further configured to:
receive a command to switch to the second navigation network;
response to receiving the command, switch to the second navigation network; and
responsive to switching to the second navigation network, automatically switch from the first mapping to the second mapping.

9. The system of claim 6, wherein:
the drawing object module is further configured to arrange the drawing into a third type of navigation network;
the user interface is further configured to switch to the third type of navigation network;
the display is further configured to display the drawing using the third type of navigation network; and
the physical processor is further configured to map the key to a third mapping comprising the key being mapped to a third command usable in the third type of network, wherein the third command is different than both the first command and the second command.

10. The system of claim 6, wherein the selectable components include switches, pins, and fuses.

11. A computer comprising:
a physical processor;
a bus connected to the physical processor;
a memory connected to the bus, wherein the memory stores instructions comprising:
computer usable program code for loading a drawing having a number of drawing objects and associated object data, wherein the associated object data describes relationships between the number of drawing objects;
computer usable program code for arranging the drawing and the associated object data into a first type of navigation network and a second type of navigation network, wherein the first type of navigation network comprises a first plurality of parameters used to interact with the drawing, and wherein the second type of navigation network comprises a second plurality of parameters used to interact with the drawing, and wherein the first plurality is different than the second plurality;
computer usable program code for selecting one of the first type of navigation network and the second type of navigation network, wherein a selected navigation network is formed;
computer usable program code for displaying the drawing using the selected navigation network;
computer usable program code for mapping a key of a keyboard to one of a first mapping and a second mapping, wherein the first mapping comprises the key being mapped to a first command usable in the first type of navigation network, wherein the second mapping comprises the key being mapped to a second command usable in the second type of navigation network, wherein the key is mapped to the first mapping when the selected navigation network is the first type of navigation network, wherein the key is mapped to the second mapping when the selected navigation network is the second type of navigation network, and wherein the first mapping and the second mapping are different;
computer code for selecting a drawing object from the number of drawing objects to view details of the drawing object;
and wherein the number of drawing objects include wires, text references, off-sheet references, and selectable components.

12. The computer of claim 11, wherein the first plurality of parameters and the second plurality of parameters include keyboard command mapping, navigation method, and object filtering.

13. The computer of claim 11, wherein the selected navigation network is the first navigation network, and wherein the instructions further comprise:
computer usable program code for receiving a command to switch to the second navigation network;
computer usable program code for, in response to receiving the command, switching to the second navigation network; and
computer usable program code for, responsive to switching to the second navigation network, automatically switching from the first mapping to the second mapping.

14. The computer of claim 11, wherein the instructions further comprise:
computer usable program code for arranging the drawing into a third type of navigation network;
computer usable program code for switching to the third type of navigation network;
computer usable program code for displaying on the display the drawing using the third type of navigation network; and
computer usable program code for mapping the key to a third mapping comprising the key being mapped to a third command usable in the third type of network, wherein the third command is different than both the first command and the second command.

15. The computer of claim 11, wherein the selectable components include switches, pins, and fuses.

* * * * *